(12) United States Patent
Van Winkelhoff et al.

(10) Patent No.: US 7,613,052 B2
(45) Date of Patent: Nov. 3, 2009

(54) MEMORY DEVICE AND METHOD OF OPERATING SUCH A MEMORY DEVICE

(75) Inventors: Nicolaas Klarinus Johannes Van Winkelhoff, Villard-Bonnot (FR); Denis René André Dufourt, Meylan (FR)

(73) Assignee: ARM Limited, Cambridge (GB)

( * ) Notice: Subject to any disclaimer, the term of this patent is extended or adjusted under 35 U.S.C. 154(b) by 176 days.

(21) Appl. No.: 11/979,359

(22) Filed: Nov. 1, 2007

(65) Prior Publication Data
US 2009/0116308 A1    May 7, 2009

(51) Int. Cl.
*G11C 5/14* (2006.01)
(52) U.S. Cl. .................. 365/189.09; 365/189.011; 365/189.11; 365/185.25; 365/185.18; 365/226
(58) Field of Classification Search ............ 365/189.09, 365/189.011, 189.11, 185.25, 185.18, 203, 365/204, 205, 226
See application file for complete search history.

(56) References Cited

U.S. PATENT DOCUMENTS

| | | | |
|---|---|---|---|
| 6,411,560 B1 * | 6/2002 | Tanizaki et al. ............. | 365/227 |
| 2002/0167849 A1 * | 11/2002 | Ohbayashi et al. ..... | 365/189.09 |
| 2005/0088881 A1 * | 4/2005 | Miki et al. ............. | 365/189.09 |

OTHER PUBLICATIONS

K. Zhang et al, "A 3-GHz 70Mb SRAM in 65nm CMOS Technology with Integrated Column-Based Dynamic Power Supply" 2005 IEEE International Solid-State Circuits Conference, pp. 474, 475, 611.
H. Pilo et al, "An SRAM Design in 65-nm Technology Node Featuring Read and Write-Assist Circuits to Expand Operating Voltage" *IEEE Journal of Solid-State Circuits*, vol. 42, No. 4, Apr. 2007, pp. 813-819.
H. Pilo et al, "An SRAM Design in 65nm and 45nm Technology Nodes Featuring Read and Write-Assist Circuits to Expand Operating Voltage" 2006 Symposium on VLSI Circuits Digest of Technical Papers.

(Continued)

*Primary Examiner*—Anh Phung
*Assistant Examiner*—Eric Wendler
(74) *Attorney, Agent, or Firm*—Nixon & Vanderhye P.C.

(57) ABSTRACT

A memory device and method of operation is provided, the memory device having a plurality of memory cells arranged in at least one column, with each column having at least one bit line and a supply voltage line associated therewith. A capacitance exists between the supply voltage line and associated at least one bit line for each column. Control circuitry is used to control, for each column, connection of a voltage source to the associated supply voltage line. For a predetermined period during a memory access operation, the control circuitry disconnects the supply voltage line for at least the selected column from the voltage source, such that a voltage level on that supply voltage line changes in response to any change in voltage on the associated at least one bit line. This basic mechanism can be used to provide a variety of assist mechanisms, such as a write assist mechanism, a bit flip assist mechanism and a read assist mechanism. The technique of the present invention provides a particularly simple and power efficient technique for providing such assist mechanisms.

18 Claims, 14 Drawing Sheets

OTHER PUBLICATIONS

S. Ohbayashi et al, "A 65-nm SoC Embedded 6T-SRAM Designed for Manufacturability With Read and Write Operation Stabilizing Circuits" *IEEE Journal of Solid-State Circuits*, vol. 42, No. 4, Apr. 2007, pp. 820-829.

M. Yabuuchi et al, "A 45nm Low-Standby-Power Embedded SRAM with Improved Immunity Against Process and Temperature Variations" 2007 IEEE International Solid-State Circuits Conference, pp. 326, 327, 606.

R. Hobson, "A New Single-Ended SRAM Cell With Write-Assist" *IEEE Transactions on Very Large Scale Integration (VLSI) Systems*, vol. 15, No. 2, Feb. 2007, pp. 173-181.

* cited by examiner

MEMORY DEVICE AND METHOD OF OPERATING SUCH A MEMORY DEVICE

BACKGROUND OF THE INVENTION

1. Field of the Invention

The present invention relates to a memory device and method of operating such a memory device, and in particular to techniques that can be employed when performing memory access operations to assist those memory access operations.

2. Description of the Prior Art

There is an increasing demand for memory devices to be constructed which are smaller and consume less power than their predecessor designs, whilst retaining high performance. New technologies are being developed which allow a reduction in size of the individual transistors making up each memory cell. However, as the memory cells decrease in size, the variation in behaviour between individual memory cells tends to increase, and this can adversely affect predictability of operation. This variation in operation of the individual memory cells can give rise to significant failure rates when trying to run the memory devices at high speed to meet the performance requirements. It is often also the case that there is a desire to use a lower power supply voltage for the memory device in order to reduce power consumption, but this can further increase the likelihood of failed operation within individual memory cells. Accordingly, in modern technologies, it is becoming more and more difficult to produce memory devices where the individual memory cells have the required stability to ensure effective retention of data (stability sometimes being measured in terms of static noise margin (SNM)), whilst also having required write-ability (WM) to ensure that new data values can be stored in the cells within the time period allowed for a write operation.

Faced with these issues, various assistance mechanisms have been developed which seek to assist individual memory cells in operating correctly when write and read operations are performed on those cells. For example, the article "A 3-GHz 70 Mb SRAM in 65 nm CMOS Technology with Integrated Column-Based Dynamic Power Supply" by K Zhang et al, Intel, published in ISSCC 2005, Session 26, describes a six transistor SRAM cell (often referred to as a 6T SRAM cell) which is stable in all conditions, but requires write assist (WA) circuitry to improve the likelihood of individual cells operating correctly when written to. The write assist circuitry disclosed in this article is illustrated schematically in FIG. 1, and is based on the idea of lowering the supply voltage to an addressed memory cell just prior to the write operation, the lower supply voltage lowering the stability of the memory cell, and therefore making it more easy to write into.

FIG. 1 shows an array of memory cells 240, 242, 244, 246, 248, 250, 252, 254 provided in association with a particular column multiplexer 260 of the memory array. Each row is addressed by a word line 200, 202, and each column has a power supply voltage provided by a supply voltage line 230, 232, 234, 236. As is known in the art, each of the columns also has a pair of bit lines 210, 212, 214, 216, 218, 220, 222, 224 associated therewith. From an address provided to the memory device, a row and column within the memory device is identified, with the addressed memory cell being the memory cell at the intersection between the identified row and column. For a read operation, the word line 200, 202 associated with the selected row is selected in order to enable a row of cells, and then the column multiplexer 260 outputs to the sense amplifier 270 an indication of the voltages on the pair of bit lines associated with the selected column to allow the sense amplifier to detect the value stored in the addressed memory cell. For a write operation, the word line is enabled in the same manner, and the voltage on one of the pair of bit lines associated with the selected column is then discharged to identify the data value to be stored in the addressed memory cell.

As shown in FIG. 1, associated with each supply voltage line, a multiplexer 262, 264, 266, 268 is provided which can select between a main supply voltage on path 275 and a specially generated lower column supply voltage provided over path 280. Just prior to the write operation, the relevant multiplexer 262, 264, 266, 268 associated with the selected column is driven to select, as the voltage output on the supply voltage line for that column, the reduced column supply voltage received over path 280. Hence, by way of example, if cell 240 is to be written to, then multiplexer 262 will output the lower column supply voltage received over path 280 to the supply voltage line 230. This will assist in performing the write operation with respect to the addressed memory cell 240. The other memory cells 248 in the selected column are not activated, since their associated word lines have not been enabled, and accordingly retain their held data values. For the other memory cells 242, 244, 246 coupled to the enabled word line 200, the supply voltage lines 232, 234, 236 are retained at the normal main supply voltage provided over path 275, since otherwise they could become unstable.

By such an approach, a higher yield can be produced, since memory cells that might otherwise fail the write-ability requirements can be caused to pass the required write-ability requirements by virtue of the reduced supply voltage used during the write operation. However, the implementation disclosed in FIG. 1 has a number of problems. Firstly, the time available to lower the supply voltage during the write operation is extremely limited, due to the short time available for performing write operations in high performance memory devices. The charge that needs to be dissipated when reducing the voltage on the supply line hence leads to large current peaks. Further, the memory requires for every output bit the use of a column with the supply voltage lowered, and this accordingly increases the current peak problem mentioned above.

Further, the design of FIG. 1 requires a dedicated voltage generator to produce the extra reduced column supply voltage over path 280, and this either needs to be accommodated within the design of the memory device, or else provided externally, with additional metal lines being provided to route the voltage supply from that voltage generator. For any change in height or width of the memory device, the capacitances observed on the various column supply voltage lines will change, and this will typically require a redesign or tuning of the voltage generator used to generate the extra column supply voltage on path 280, to ensure that the voltage on the column supply voltage line can be reduced sufficiently quickly in the short period of time allowed before the write occurs to the addressed memory cell. Such voltage generators will also be susceptible to temperature and voltage variations, which may require correcting circuits to be added.

In addition to these problems, in memory devices designed for low power applications, the presence of the additional voltage generator leads to significant power consumption since the additional voltage supply must be maintained at all times to enable that supply voltage to be available ahead of any write operation.

In the articles "An SRAM Design in 65-nm Technology Node Featuring Read and Write-Assist Circuits to Expand Operating Voltage" by H Pilo et al, IEEE Journal of Solid- State Circuits, Volume 42, No. 4, April 2007, and "An SRAM Design in 65 nm and 45 nm Technology Nodes Featuring Read and Write-assist Circuits to Expand Operating Voltage" by H Pilo et al, 2006 Symposium on VLSI Circuits, Digest of Technical Papers, a write-assist feature is described which also makes use of an additional column supply voltage (referred to in the articles as VWR) for coupling to a column containing an addressed memory cell to be written to. In accordance with the technique described therein, a special onboard voltage generator is provided for globally generating the VWR voltage from the VDD supply voltage. This onboard voltage generator uses a push-pull transistor stage in order to generate the VWR voltage level. Band gap reference circuits are also used for the push-pull transistor stage. A disadvantage of such an approach is that a significant DC current is produced by the band gap generator circuitry used, and power is lost in charging and discharging the column supply line with different voltages every write cycle. Hence, such an approach is likely to be unacceptable in many memory devices, for example those designed for low power applications. Further, the band gap generator and push-pull transistor stage consume valuable space within the memory device.

The article "A 65-nm SoC Embedded 6T-SRAM Designed for Manufacturability with Read and Write Operation Stabilizing Circuits" by S Ohbayashi et al, IEEE Journal of Solid-State Circuits, Volume 42, No. 4, April 2007, describes a capacitive write assist circuit, where an additional metal line (referred to as the downvdd line in the article) is formed in a fourth metal layer, and preset to ground potential. During the write operation that downvdd line is connected to the relevant column supply voltage line in a second metal layer to cause charge redistribution to occur between the connected column supply voltage line and the downvdd line, leading to a drop in voltage on the column supply voltage line. Whilst this approach can reduce the voltage on the column supply voltage line very quickly, it does require the provision of an extra metal line within the memory circuit, along with the use of a pre-charge circuit in association with that extra line to pre-charge that line to a ground level, giving rise to power loss associated with such precharge circuits. The provision of such an additional line is likely to increase cost, and may prove difficult to incorporate within high density memory designs. Further, the increase in power consumption associated with the precharge circuits provided for that additional line may be unacceptable in certain memory devices, for example those designed for low power applications.

The article "A 45 nm Low-Standby-Power Embedded SRAM with Improved Immunity Against Process and Temperature Variations" by M Yabuuchi et al, published in ISSCC 2007, Session 18, describes a similar write assist circuit making use of an additional line to share charge with the selected column supply voltage line during a write operation.

The article "A New Single-Ended SRAM Cell with Write-Assist" by R Hobson, IEEE Transactions on Very Large Scale Integration (VLSI) Systems, Volume 15, No. 2, February 2007, describes a 6T SRAM cell with a write-assist feature. A single-ended I/O (SEIO) bit line variation on the 6T SRAM structure is proposed where both reading and writing take place over a common SEIO bit line, and a floating ground line is used in place of the traditional second bit line. During a write operation, the floating ground line is selectively connected to one of the internal nodes of the memory cell to improve write-one performance. The disadvantages of such an approach are that it involves a significant modification to the standard SRAM memory cell, results in a non-regular layout which may prove difficult to implement, and will result in a slow read operation due to the use of a single bit line.

Accordingly, it would be desirable to provide an improved form of assist mechanism for use in a memory device, which is simpler, and consumes less power, than the known prior art techniques.

SUMMARY OF THE INVENTION

Viewed from a first aspect, the present invention provides a memory device comprising: a plurality of memory cells arranged in at least one column; at least one bit line associated with each of said at least one columns, during a memory access operation a change in voltage on said at least one bit line associated with a selected column indicating a data value for an addressed memory cell in that selected column; a supply voltage line associated with each of said at least one columns, the supply voltage line being connectable to a voltage source to provide a supply voltage to the associated column, for each column a capacitance existing between the associated supply voltage line and the associated at least one bit line; and control circuitry for controlling, for each column, connection of the voltage source to the associated supply voltage line, for a predetermined period during the memory access operation the control circuitry disconnecting the supply voltage line for at least the selected column from the voltage source, such that a voltage level on that supply voltage line changes in response to the change in voltage on the associated at least one bit line.

In accordance with the present invention, advantage is taken of the existing cross capacity which is already present in a standard memory cell. In particular, for each column, a capacitance exists between the supply voltage line for that column and the associated bit line or pair of bit lines for that column. In accordance with the present invention, this is utilised to bring about a change in the voltage level on the supply voltage line during certain memory access operations. In particular, for a predetermined period during the memory access operation, control circuitry is used to disconnect from the voltage source the supply voltage line for at least a selected column. Accordingly, when the voltage level changes on an associated bit line, the cross capacitance between the bit line and the supply voltage line brings about a change in voltage level on the supply voltage line that can be used to assist correct operation in a variety of memory access operations.

In particular, it has been found that the technique of the present invention can be used not only as a write assist mechanism, but by altering the timing at which the supply voltage line is disconnected from the voltage source, can also be used at a later stage in a write operation to assist in the flipping of a state within the addressed memory cell, or indeed can be used as a read assist mechanism in a read operation.

Depending on the type of assist mechanism being implemented, the predetermined period of the memory access operation for which the supply voltage line is disconnected from the voltage source may be the entire period of the memory access operation, or some particular portion of the time taken to perform the memory access operation.

Depending on how the various supply voltage lines and bit lines are laid out within the memory cell, and factors such as whether the bit lines are precharged to a high voltage level or precharged to a low voltage level, the supply voltage line which is controlled by the control circuitry may be either the power supply voltage line connected to a power supply voltage source, or a ground supply voltage line connected to a ground voltage source. However, in typical memory devices, the manner in which the power supply voltage lines are laid out with respect to the bit lines provides a good capacitance between each power supply voltage line and its associated bit line or bit lines, and in addition the bit lines are typically precharged to a high voltage level, and for this reason it will typically be the case that the power supply voltage line is the supply voltage line that is controlled by the control circuitry in the above-described manner.

Through use of the present invention, the assistance mechanism is provided at a local level, and any change in the width or height of the memory is addressed automatically by the assist mechanism without any requirement for redesign or tuning. Since the basic functionality works on capacitances and the effect of charge re-distribution, the idea is almost free of the classical sensitivity to temperature and voltage variations. Further, since no additional voltage generators are required, and no additional metal lines need to be added to the memory device, the solution does not incur additional power consumption, hence providing a particularly power efficient implementation.

The plurality of memory cells within the memory device can be arranged in a variety of ways. In one embodiment, the plurality of memory cells are arranged as an array comprising a plurality of rows and a plurality of columns, during the memory access operation a selected row from said plurality being enabled to identify the addressed memory cell in the selected column.

In one embodiment, each column may have a single bit line associated therewith. However, in an alternative embodiment, for each column said associated at least one bit line comprises a pair of bit lines, and during the memory access operation a differential in voltage between the pair of bit lines associated with a selected column indicates a data value for the addressed memory cell in that selected column.

The assist mechanism of the present invention can be used for a variety of memory access operations. In one embodiment, the memory access operation is a write operation, during the write operation the voltage on said at least one bit line associated with the selected column being changed to indicate a new data value to be stored in the addressed memory cell, prior to changing the voltage on said at least one bit line, the control circuitry disconnecting the supply voltage line for at least the selected column from the voltage source, such that the voltage level on that supply voltage line changes in response to the subsequent change in voltage on the associated at least one bit line. Hence, by disconnecting the supply voltage line prior to changing the voltage on the at least one bit line, then the change in voltage subsequently occurring on the bit line as dictated by the data value to be written causes a change in voltage in the same direction on the supply voltage line which thereby assists the write operation by de-stabilizing the cell.

In particular, in one embodiment, the at least one bit line associated with the selected column is precharged to a first voltage level, and during the write operation the new data value is indicated by lowering the voltage on said at least one bit line from the first voltage level, the capacitance between said at least one bit line and the associated supply voltage line causing a lowering of the supply voltage to the addressed memory cell lowering the stability of the addressed memory cell.

In embodiments where a pair of bit lines are associated with each column, then during the write operation the voltage on one of the bit lines in the pair is lowered such that the differential in voltage between the pair of bit lines indicates the new data value to be stored in the addressed memory cell, this lowering in the voltage on one of the bit lines causing a drop in voltage in the supply voltage line by virtue of the cross-capacitance.

In a typical memory device, certain leakage current will be associated with the various memory cells, and leakage current typically increases the temperature. Due to such leakage current, it is possible that the change in voltage occurring on the supply voltage line due to the cross-capacitance with its associated bit line may be supplemented as a result of the leakage current, such that the overall change in voltage is larger than expected. This could potentially affect the memory retention functionality of any non-addressed memory cells in the selected column. In one embodiment, in order to alleviate any such concerns, the control circuitry further comprises diode circuitry provided for each column to couple the voltage source to the associated supply voltage line, the diode circuitry operating to avoid the supply voltage on the associated supply voltage line dropping below a predetermined threshold value, thereby securing memory retention functionality of any non-addressed memory cells in the selected column. Hence, if for some reason the voltage on the supply voltage line drops more than expected and reaches a predetermined threshold value, then the forward biased diode circuitry will be activated to pull the voltage up so as to keep it above the predetermined threshold value.

In one embodiment, the amount by which the voltage level on a supply voltage line changes in response to the change in voltage on the associated at least one bit line depends on the capacitance existing between that supply voltage line and the associated at least one bit line and the capacitance of the supply voltage line itself. In one embodiment, at least one of these two different capacitances can be tuned during design of the memory device having regard to a desired amount for the change of the voltage level on the supply voltage line. In particular, if the capacitance of the supply voltage line itself is increased, for example by attaching open transistors to the supply voltage line, then the amount by which the voltage will drop during the write operation will be reduced. Similarly, if the capacitance between the supply voltage line and the associated bit line is increased, that will increase the amount by which the voltage on the supply voltage line drops during the write operation.

In one embodiment, the memory device further comprises one or more components selectively connected to each supply voltage line to allow the capacitance of that supply voltage line to be tuned after production having regard to a desired amount for the change of the voltage level on that supply voltage line. For example, a transistor and capacitor connected in series can be used to selectively connect the capacitor to the supply voltage line so as to increase its capacitance if desired.

There are a number of additional benefits arising through use of embodiments of the present invention. For example, considering write operations, the cross capacitance between the bit line and associated column supply voltage line speeds up the lowering of the voltage on the bit line, thereby increasing write speed. Further, since the amount by which the voltage level on a supply voltage line changes is associated with both the capacitance between the supply voltage line and the associated bit line(s), and the capacitance of the supply voltage line itself, it has been found that the voltage change can be kept relatively constant for a variety of different memory designs. In particular, as the height of the memory increases, this increases the length of the supply voltage lines and associated bit lines, which increases the capacitance existing between the supply voltage line and associated bit line(s). At the same time, the capacitance of the supply voltage line itself increases with the length of the supply voltage line, and these two effects counterbalance each other so as to produce similar voltage changes irrespective of the height of the memory device.

Further, process variations in metal height and width tend to affect both capacitances equally, and accordingly have little to no effect on the voltage change. For example, if the metal width of the column supply line increases, this increases the capacitance of the column supply line, but also reduces the distance between the column supply line and the bit lines, thereby increasing the capacitance between the bit lines and the column supply line.

Further, in accordance with embodiments of the present invention, no high current is generated in the very short period before writing, i.e. the current occurring due to the redistribution of charge is not high when compared with the normal write discharge currents involved when performing the write operation.

Furthermore, the relative timing between lowering the column supply voltage and lowering the bit line is optimised, since the lowering of the voltage on the bit line causes the lowering of the column supply voltage, and avoids any such timing issues present with prior art techniques.

In addition, no DC current is drawn when lowering the column supply voltage, such DC current being commonplace in many voltage regulators such as would be used to provide the additional voltage supply as discussed earlier with reference to the prior art of FIG. 1.

Furthermore, the technique of embodiments of the present invention will continue to work well at very low voltages, and this makes the technique also generally suitable for a variety of other assist mechanisms to address problems that can occur at low voltages.

For example, at low operating voltages, when flipping the state of a memory cell during a write operation, it may be the case that the internal nodes within the memory cell fail to stabilize out at the new required voltage levels and this can lead to a write failure in some situations. However, in accordance with one embodiment of the present invention, the technique of the present invention can be used to provide a bit flip assist mechanism.

In particular, in one embodiment, the memory access operation is a write operation, during the write operation the voltage on said at least one bit line associated with the selected column being changed to indicate a new data value to be stored in the addressed memory cell, after changing the voltage on said at least one bit line, the control circuitry disconnecting the supply voltage line for at least the selected column from the voltage source, such that the voltage level on that supply voltage line changes in response to a subsequent change in voltage on the associated at least one bit line. By disconnecting the supply voltage line from the voltage source towards the end of the write operation, a subsequent change in voltage on the bit line can be used to boost the potential difference across the memory cell so as to improve stabilisation of the new data value within the addressed memory cell, and hence assist in completing the bit flip process within the memory cell.

In one particular embodiment, during the write operation the new data value is indicated by lowering the voltage on said at least one bit line associated with the selected column, towards the end of the write operation the voltage on said at least one bit line being increased whilst the supply voltage line for at least the selected column is disconnected from the voltage source, the capacitance between said at least one bit line and the associated supply voltage line causing an increase of the supply voltage to the addressed memory cell, thereby improving stabilisation of the new data value within the addressed memory cell. In one particular embodiment, this process of increasing the voltage on the at least one bit line can be performed as part of a standard precharge operation occurring at the end of the write operation to return the bit lines to their precharged high voltage level.

As another example of the flexibility of the basic mechanism of the present invention, this basic mechanism can also be used in one embodiment to provide a read assist operation. In particular, in one embodiment, during a read operation the voltage on said at least one bit line associated with the selected column is precharged to a first voltage level during a precharge stage, whereafter said voltage on said at least one bit line associated with the selected column changes from said first voltage level in dependence on the data value stored in the addressed memory cell, the control circuitry disconnecting the supply voltage line for at least the selected column from the voltage source during the precharge stage, such that the voltage level on that supply voltage line changes in response to the change in voltage on the associated at least one bit line during the precharge stage.

In one particular embodiment, the first voltage level is the VDD power supply voltage level and the process requires at least one bit line having been discharged prior to the start of the read operation in order to require a precharge of that bit line back up to the VDD voltage level. Hence, in such embodiments, the voltage on said at least one bit line associated with the selected column increases during the precharge stage, whereafter said voltage on said at least one bit line lowers from said first voltage level in dependence on the data value stored in the addressed memory cell, the capacitance between said at least one bit line and the associated supply voltage line causing an increase of the supply voltage to the addressed memory cell during the precharge stage, thereby increasing stability of the addressed memory cell for the read operation. Since the supply voltage to the addressed memory cell is increased during the precharge stage, this increases the stability of the addressed memory cell for the subsequent read operation. This hence ensures that the subsequent read operation is less likely to disturb the stored state of the memory cell. Further, since the supply voltage level is increased, this increases the read current through the memory cell and hence leads to a faster read operation.

In embodiments where a pair of bit lines are associated with each column, in one embodiment one of the bit lines can be discharged prior to the precharge operation associated with the read operation such that when that bit line is subsequently precharged, this gives a boost to the supply voltage level on the supply voltage line. However, if desired, both of the bit lines in the pair can be discharged, so that during the precharge operation both of them are precharged back up to VDD, this giving a further increase to the voltage on the supply voltage line, thereby further improving stability and increasing read current in the subsequent read stage of the operation.

Such embodiments are particularly useful in implementations where low voltage is used in the memory device, since in low voltage applications stability of the memory cells during read operations becomes a significant issue.

In some embodiments, it may be possible that such a boost in the voltage of the supply voltage line causes the absolute voltage level to exceed a level which is safe having regard to the technology used for the components of the memory device. To alleviate such concerns, in one embodiment the control circuitry further comprises diode circuitry provided for each column to couple the voltage source to the associated supply voltage line, the diode circuitry operating to avoid the supply voltage on the associated supply voltage line increasing above a predetermined threshold value. In particular, a reverse biased diode can be placed between the voltage source and the supply voltage line to limit the boost in voltage that can be applied to the supply voltage line.

Viewed from a second aspect, the present invention provides a memory device comprising: a plurality of memory cells means arranged in at least one column; at least one bit line means associated with each of said at least one columns, during a memory access operation a change in voltage on said at least one bit line means associated with a selected column indicating a data value for an addressed memory cell means in that selected column; a supply voltage line means associated with each of said at least one columns, the supply voltage line means being connectable to a voltage source means for providing a supply voltage to the associated column, for each column a capacitance existing between the associated supply voltage line means and the associated at least one bit line means; and control means for controlling, for each column, connection of the voltage source means to the associated supply voltage line means, for a predetermined period during the memory access operation the control means disconnecting the supply voltage line means for at least the selected column from the voltage source means, such that a voltage level on that supply voltage line means changes in response to the change in voltage on the associated at least one bit line means.

Viewed from a third aspect, the present invention provides a method of operating a memory device, the memory device having a plurality of memory cells arranged in at least one column, and at least one bit line associated with each of said at least one columns, during a memory access operation a change in voltage on said at least one bit line associated with a selected column indicating a data value for an addressed memory cell in that selected column, the memory device further having a supply voltage line associated with each of said at least one columns, the supply voltage line being connectable to a voltage source to provide a supply voltage to the associated column, for each column a capacitance existing between the associated supply voltage line and the associated at least one bit line, the method comprising the steps of: controlling, for each column, connection of the voltage source to the associated supply voltage line; and for a predetermined period during the memory access operation, disconnecting the supply voltage line for at least the selected column from the voltage source, such that a voltage level on that supply voltage line changes in response to the change in voltage on the associated at least one bit line.

BRIEF DESCRIPTION OF THE DRAWINGS

The present invention will be described further, by way of example only, with reference to embodiments thereof as illustrated in the accompanying drawings, in which.

DESCRIPTION OF EMBODIMENTS

Figure 1:
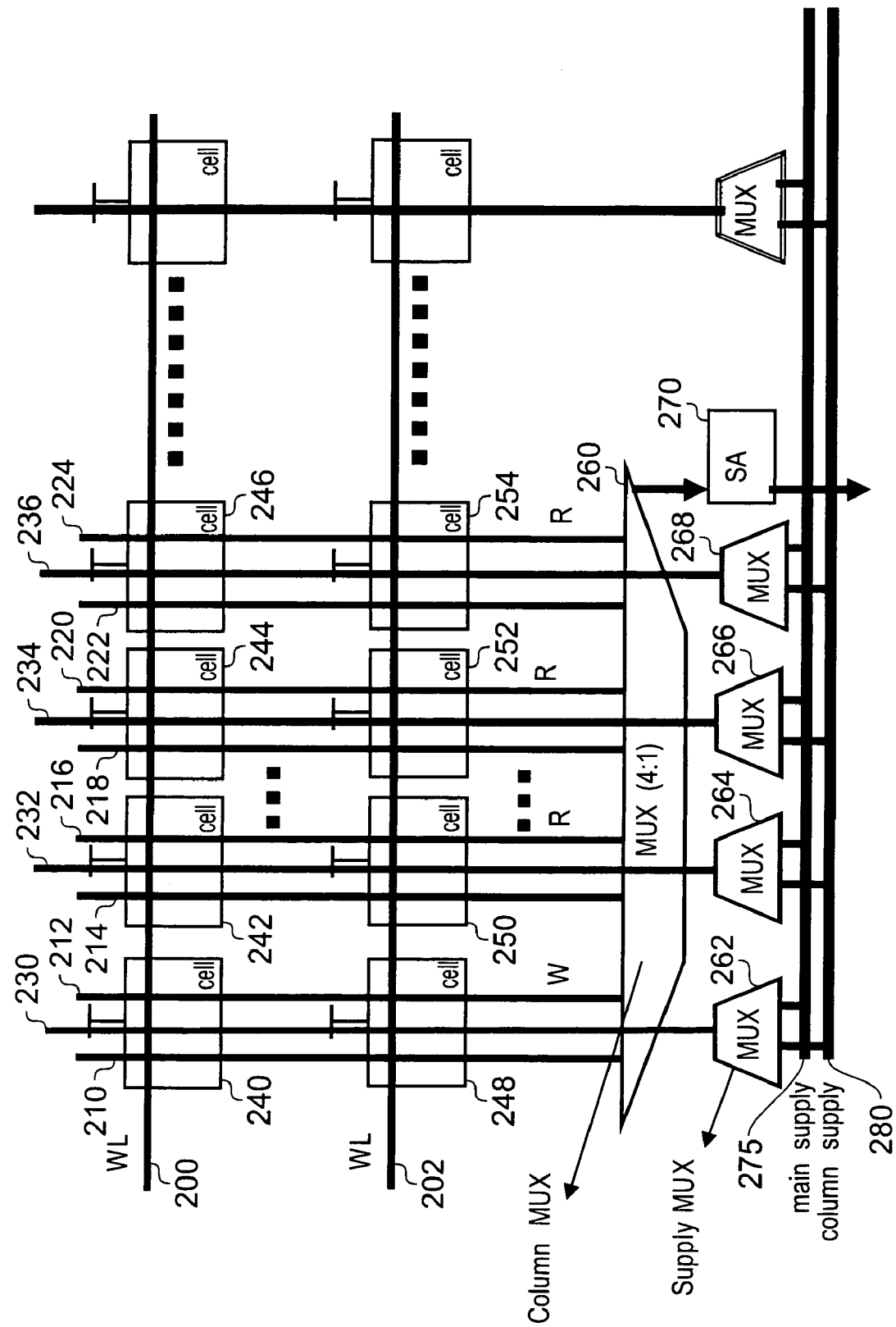
FIG. 1 is a diagram schematically illustrating a write assist mechanism in accordance with a prior art technique.
Figure 2:
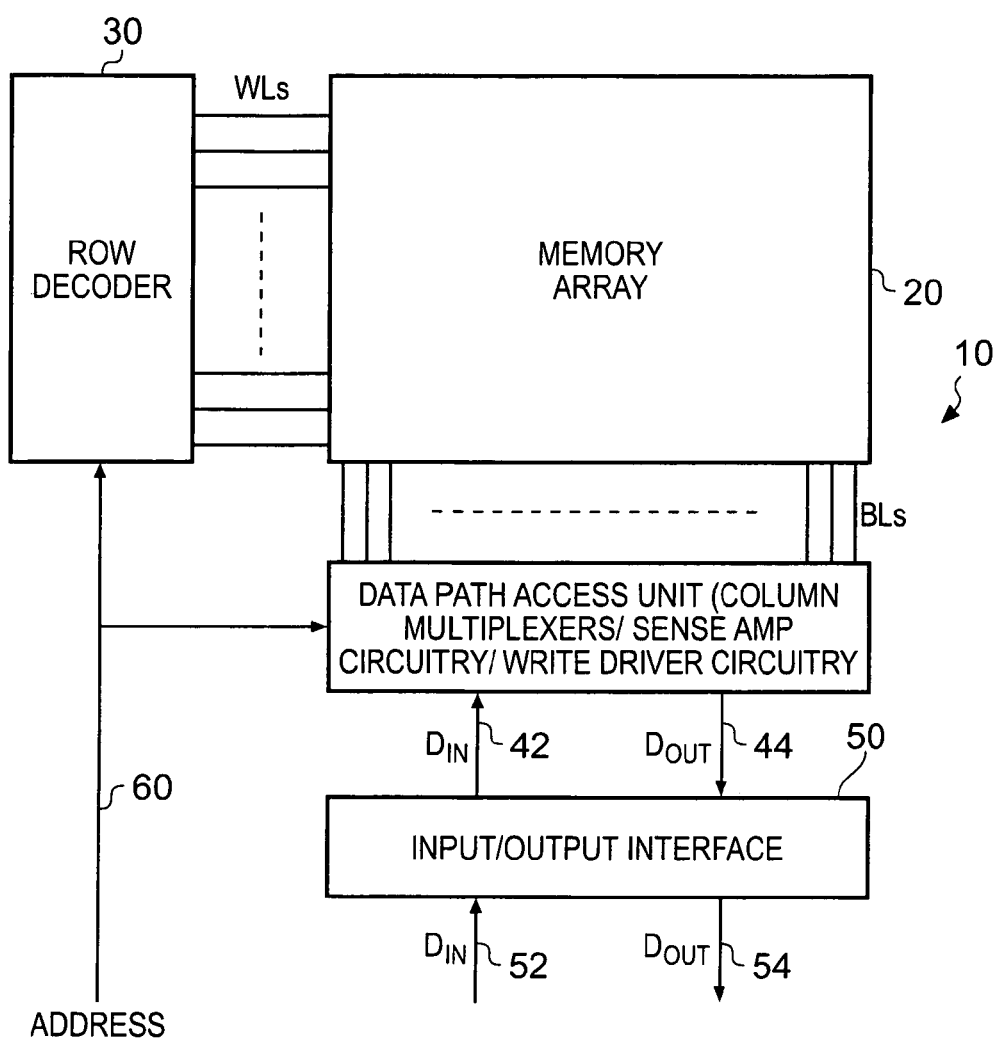
FIG. 2 is a block diagram of a memory device in which embodiments of the present invention may be employed.

FIG. 2 is a block diagram of a memory device. The memory device 10 has a memory array 20 consisting of a plurality of memory cells arranged in rows and columns. Each row has a word line (WL) connected thereto, and each column has at least one bit line (BL) connected thereto, the exact number of bit lines connected to each column being dependent on the implementation. In one example implementation, the memory array consists of SRAM cells, and a pair of bit lines are connected to each column of cells.

When a memory access request is received by the memory device, the address specified by the memory access request is routed over path 60 to a row decoder 30 and to a data path access unit 40. The row decoder 30 is arranged to decode the address and dependent thereon drive a control signal over one of the word lines in order to select one of the rows within the memory array 20. Similarly, the data path access unit 40 is arranged dependent on the address to identify the column or columns containing the data to be accessed, and to activate the respective bit lines.

Typically each memory cell stores a single bit data value, and accordingly if the data being accessed is a multi-bit data word (e.g. 32 bits, 64 bits, etc), it will be necessary to access multiple memory cells. In a typical design, column multiplexers will be provided corresponding to each bit of the data word, each column multiplexer being connected to the bit lines for a plurality of columns containing memory cells in which the associated bit of the data word can be stored. The memory array can hence be considered to be formed of a plurality of sections, one for each column multiplexer. Hence, by way of example a memory array may have 512 word lines, a multiplexer size of 4 (meaning 4 columns are connected to each multiplexer), and a data word size of 32 bits (meaning there are 32 column multiplexers, each column multiplexer being connected to a corresponding section of the memory array). Such a memory can hence store 2048 32-bit data words.

For a read operation, the relevant word line is enabled via the row decoder, the appropriate bit lines are activated by being selected via the column multiplexers, and then sense amplifier circuitry is used to observe variation on the voltage of the bit lines in order to determine for each addressed memory cell the bit value stored therein. In particular, considering the earlier-mentioned SRAM example where a pair of bit lines are connected to each memory cell, these bit lines will initially be precharged to a power supply voltage level, and when the relevant row of cells are selected via a drive signal on the relevant word line, one of the pair of bit lines connected to an addressed memory cell will start to discharge towards a ground voltage level, which of the bit lines in the pair discharges being dependent on the bit value stored therein. For each addressed memory cell (one addressed memory cell per column multiplexer), the discharging of one of the bit lines in the pair is sensed by the sense amplifier circuitry, which then produces an output signal over path 44 indicating the data word stored in the addressed memory cells. The output signal is then routed via the input/output interface 50 over path 54 to be returned as the read data to the source of the read access request.

For a write access request, the row decoder 30 operates in the same manner to select the relevant row by issuing a drive signal on the associated word line, and then for each section of the memory array write driver circuitry in the data path access unit 40 is used to alter the voltage on the relevant bit line or bit lines in order to cause the state held in the addressed memory cells to be updated to reflect the data word being written. Hence, the write data is routed over path 52 to the input/output interface 50 and from there over path 42 to the data path access unit 40. The write data will then be used to generate the appropriate control signals for the write driver circuitry to cause the voltage on the relevant bit lines to be altered to cause the state of the addressed memory cells to be updated. Hence, again considering the earlier-mentioned SRAM example, both of the bit lines associated with a particular addressed memory cell will initially be precharged, and dependent on the data to be written, one of the bit lines in the pair will be discharged by the write driver circuitry to cause the state in the addressed memory cell to be updated.

Figure 3:
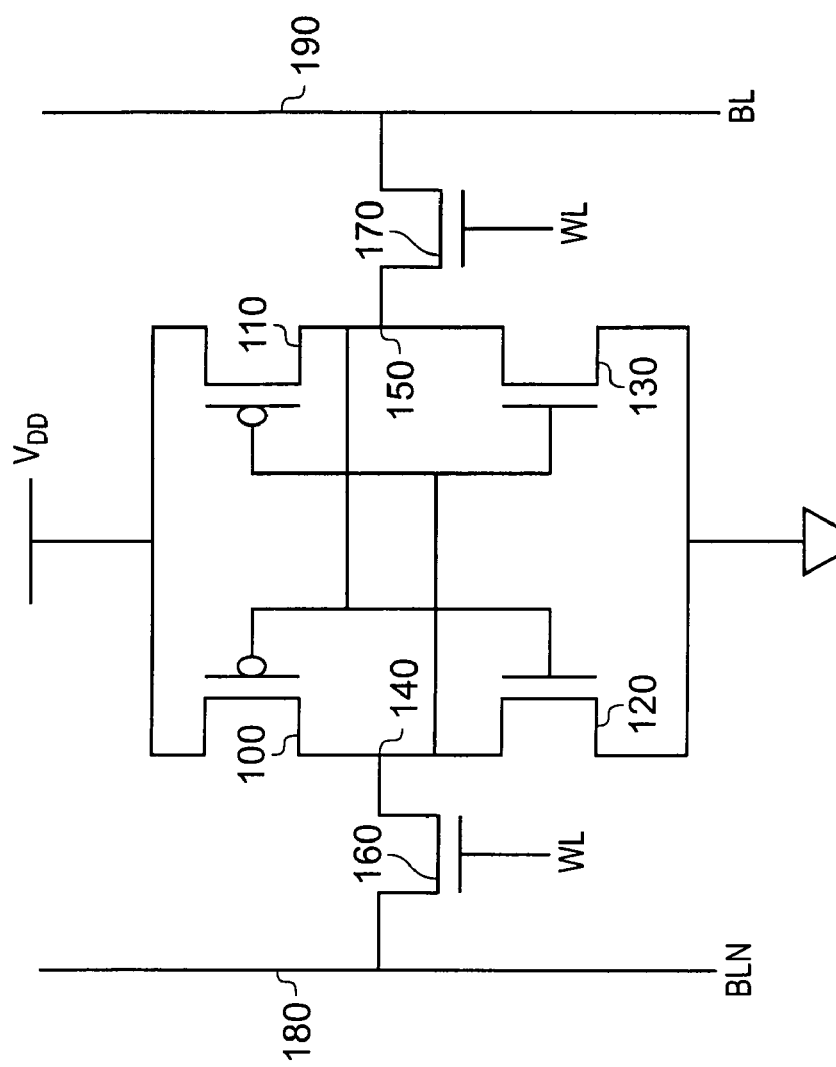
FIG. 3 is a diagram illustrating an example construction of a memory cell that may be used within the memory array of FIG. 2.

The memory cells of the memory device can take a variety of forms. However, by way of example, FIG. 3 is a diagram illustrating an example construction of a 6T SRAM memory cell that may be used in an SRAM memory. As can be seen, the memory cell consists of two PMOS transistors 100, 110 and two NMOS transistors 120, 130. A node 140 is provided between the PMOS transistor 100 and the NMOS transistor 120, and similarly a node 150 is provided between the PMOS transistor 110 and the NMOS transistor 130. The bit line 180 is connected to the node 140 via an access transistor 160, and similarly the bit line 190 is connected to the node 150 via an access transistor 170.

Two different states can be stored within the memory cell shown in FIG. 3, a first state being where the node 140 is at a ground potential and the node 150 is at a power supply potential $V_{DD}$, and the second state being a state where the node 140 is at the power supply potential $V_{DD}$ and the node 150 is at the ground potential.

Figure 4:
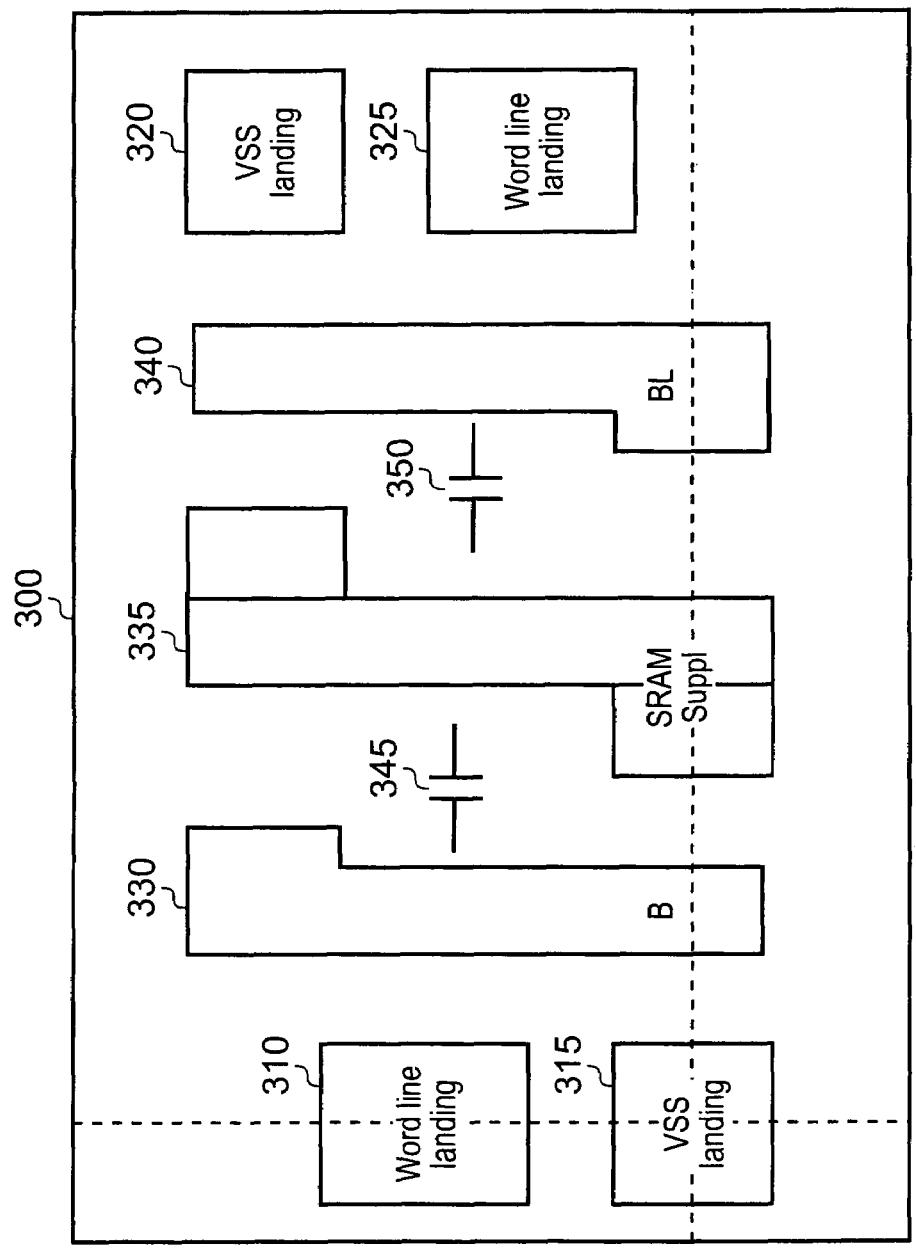
FIG. 4 is a diagram schematically illustrating the layout of bit lines and an associated power supply voltage line provided within a particular metal layer of the memory device in accordance with one embodiment of the present invention.

As mentioned previously, in modern technologies, it is becoming more and more difficult to produce memory devices where the individual memory cells have the required stability to ensure reliable retention of data, whilst also having required write-ability to ensure that new data values can be stored in the cells within the time period allowed for a write operation. For some cells the write-ability problem cannot be addressed even by increasing the write time, since for such cells the internal flipping of the state required to store a new data value may never occur even with unlimited time. In accordance with embodiments of the present invention, advantage is taken of the existing cross capacity which is already present in a standard memory cell such as that illustrated in FIG. 3. This cross capacity is illustrated schematically in FIG. 4, which shows a particular metal layer 300 provided within a memory device to form the relevant bit lines and power supply voltage lines used by the memory device. In particular, FIG. 4 shows the portion of the metal layer 300 provided for a particular column of memory cells. As shown, a pair of bit lines 330, 340 are provided and located between those bit lines is a power supply voltage line 335 running generally parallel between the pair of bit lines. Also provided are a pair of word line landing locations 310, 325 and a pair of ground potential landing locations 315, 320 which can be coupled to word lines and ground potential lines provided in another metal layer of the device. Typically the word lines and ground lines run generally perpendicular to the bit lines 330, 340 and power supply voltage line 335 in an overlying metal layer.

As illustrated in FIG. 4, a capacitance 345 exists between the first bit line 330 and the power supply voltage line 335, and similarly a capacitance 350 exists between the power supply voltage line 335 and the other bit line 340.

In accordance with embodiments of the present invention, for a predetermined period during a memory access operation, the power supply voltage line 335 is disconnected from the power supply voltage rail $V_{DD}$, such that a change in voltage on one or both of the bit lines 330, 340 then brings about a change in the voltage level on the power supply voltage line due to the cross capacitance 345, 350, this change in voltage level being used to assist correct operation in a variety of memory access operations. As will be discussed in more detail with reference to the following diagrams, this same basic cross capacitance mechanism can be used to provide a write assist mechanism, a bit flip assist mechanism for the latter stage of a write operation, or a read assist mechanism for a read operation.

The amount by which the voltage level on the power supply voltage line 335 changes in response to a change in voltage on the associated bit lines 330, 340 is dependent on the capacitances 345, 350 existing between that power supply voltage line and the associated bit lines, and the capacitance of the power supply voltage line 335 itself. In particular, if the cross capacitances 345, 350 increase, then this will increase the change in voltage occurring on the power supply voltage line 335 when a voltage changes on the associated bit lines 330, 340. In contrast, if the capacitance of the power supply voltage line 335 increases, this will reduce the voltage drop on the power supply voltage line. Accordingly, it has been found that the voltage drop can be kept relatively constant for a variety of different memory designs. In particular, it will be appreciated that as height of the memory device increases, then both the bit lines 330, 340 and associated power supply voltage line 335 increase in length. This will naturally increase the cross capacitances 345, 350, but will also increase the capacitance of the power supply voltage line 335 itself, with the two effects then counterbalancing/tracking each other.

It will also be appreciated that the actual voltage drop occurring on the power supply voltage line 335 can be tuned during design by altering the gap between the power supply voltage line 335 and the associated bit lines. If the gap is reduced, the cross capacitances 345, 350 will increase, thereby increasing the voltage drop occurring on the power supply voltage line 335. If the capacitance of the power supply voltage line 335 is increased by thickening the wire used to provide the power supply voltage line, or making it longer, then this will reduce the voltage drop. The capacitance of the power supply voltage line 335 can also be increased by coupling open transistors to the power supply voltage line to increase the capacitance, or indeed the power supply voltage line can be coupled via a transistor to a further capacitor, to allow extra capacitance to be connected or disconnected from the power supply voltage line post production, so as to allow some further tuning to take place after manufacture.

It will be appreciated that the technique of embodiments of the present invention, utilising the cross capacitance between the power supply voltage line and the associated bit lines, can be used in a variety of implementations, and not only implementations where the power supply voltage line and bit lines are arranged as shown in FIG. 4. For example, even if the power supply voltage line were in a different metal layer to the bit lines, there would still be cross capacitance exhibited between them, and accordingly the same approach could also be used. Similarly, if the power supply voltage line is not laid in parallel with the bit lines, there would again still be cross capacitance between the power supply voltage line and the bit lines, thereby allowing the technique of embodiments of the present invention to be utilised. However, when the power supply voltage line is provided in parallel with the bit lines, the earlier-mentioned benefits of scaling can be realised, ensuring consistency in the amount of voltage drop across a variety of different designs.

Figure 5:
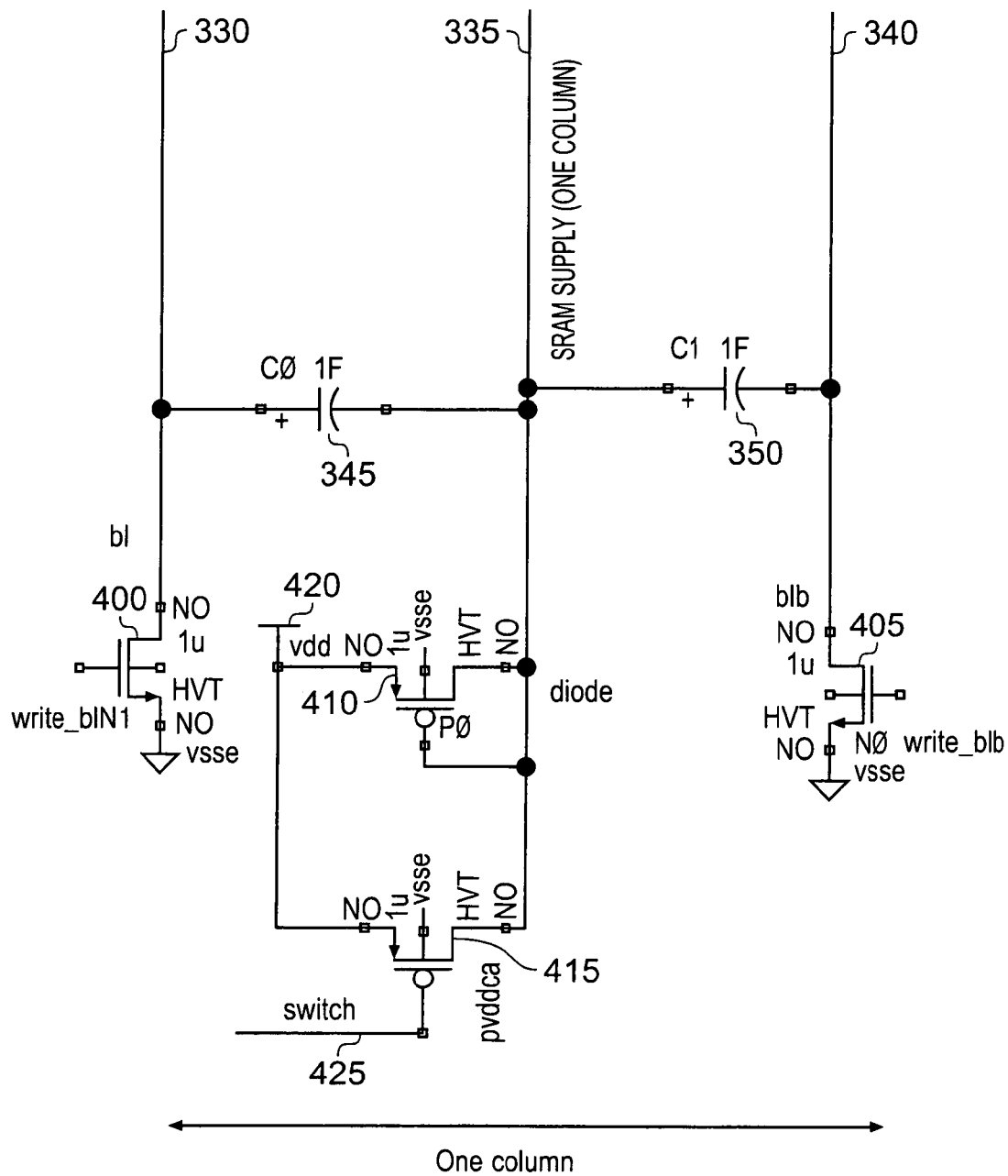
FIG. 5 schematically illustrates, for a particular column of the memory device, the arrangement of a write assist mechanism in accordance with one embodiment of the present invention.

FIG. 5 illustrates for one column of memory cells various components used to implement the write assist mechanism of embodiments of the present invention. As can be seen, each power supply voltage line 335 is located between an associated pair of bit lines 330, 340, with the cross capacitances 345, 350 existing therebetween. Write transistors 400, 405 are connected to each bit line 330, 340, so that during the write operation one of the bit lines (which will have been precharged to the power supply voltage level $V_{DD}$) can be discharged towards ground to identify the data value to be stored into the addressed memory cell.

Control circuitry in the form of PMOS transistor 415 is provided for selectively connecting the power supply voltage line 335 to the power rail $V_{DD}$ 420. Typically, a logic zero value will be provided over the switch line 425 to the PMOS transistor 415, so that the power supply voltage line 335 is connected to the power supply, and accordingly the voltage on the power supply voltage line 335 is $V_{DD}$. However, as will be discussed in more detail with reference to FIG. 6, when employing the write assist mechanism of embodiments of the present invention, a logic one value is provided over the switch path 425 to switch off the transistor 415 prior to the voltage on the relevant one of the bit lines 330, 340 being discharged during the write operation, so that by the time that discharging operation takes place, the power supply voltage line 335 is decoupled from the power supply rail 420. As a result, the subsequent discharging of one of the bit lines 330, 340 causes a reduction in the voltage level on the power supply voltage line 335, thereby lowering the stability of the addressed memory cell (i.e. the memory cell in the column whose associated word line is enabled), hence assisting completion of the write operation.

As shown in FIG. 5, an optional forward biased diode 410 (in this case implemented by a PMOS transistor whose gate input is coupled to the power supply voltage line 335) can be used to guarantee that a minimum voltage level is retained on the power supply voltage line 335, thereby avoiding the voltage on the power supply voltage line dropping below a predetermined threshold value. This can be useful in securing the memory retention functionality of any non-addressed memory cells in a selected column. In particular, leakage current might cause the voltage level on the power supply voltage line 335 to drop to a level below that expected purely as a result of the cross capacitance drop, and this can become significant particularly when operating at high temperatures where leakage current increases. A diode formed by a transistor 410 will typically have a threshold voltage of about 200 mV, and accordingly, by way of example, if the power supply rail 420 is at 1V this will ensure that the voltage on the power supply voltage line 335 does not drop below 0.8V. This can hence ensure the memory retention functionality of the non-addressed memory cells, whilst allowing the voltage supply level to drop sufficiently to assist the write operation in the addressed memory cell.

Figure 6:
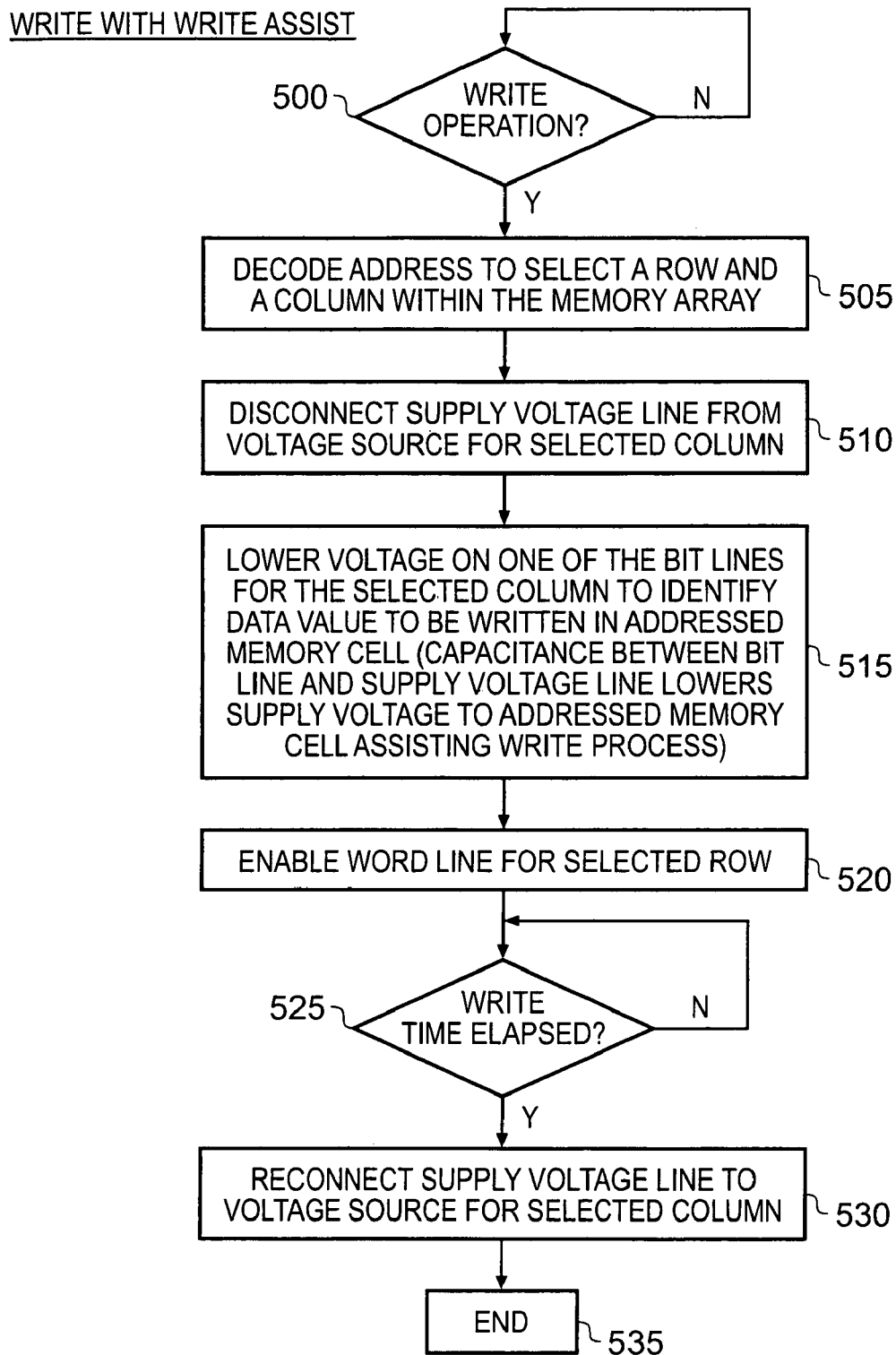
FIG. 6 is a flow diagram illustrating the operation of the write assist mechanism in accordance with one embodiment of the present invention.

FIG. 6 is a flow diagram illustrating the write assist mechanism in accordance with one embodiment of the present invention. At step 500, the occurrence of a write operation is awaited, and when a write operation is to take place, the process proceeds to step 505, where the address specified by the write operation is decoded to select a row and a column within the memory array. At step 510, the power supply voltage line 335 is disconnected from the voltage source 420 for the selected column by driving a logic one value over path 425 to the relevant PMOS transistor 415 to turn that transistor off.

Thereafter, at step 515, the voltage on one of the bit lines 330, 340 for the selected column is lowered to identify the data value to be written in the addressed memory cell. As discussed earlier, this is done by switching on the relevant write transistor 400, 405 by driving a logic one level at its gate input. During this process, the cross capacitance 345, 350 between the relevant bit line and the power supply voltage line will cause the voltage level on the power supply voltage line 335 to drop, thereby destabilising the addressed memory cell and assisting in the write operation.

At step 520, the word line for a selected row is enabled. It will be appreciated that the word line can be enabled at any point after the address has been decoded at step 505, and accordingly may occur at least partially in parallel with steps 510 or 515.

At step 525, it is determined whether the write time has elapsed. Typically, a predetermined write time will be associated with the memory device, which will be set having regard to the expected write time under worst case conditions in the memory cell. Once the write time has elapsed, the process proceeds to step 530, where a logic zero value is provided over the switch path 425 to reconnect the power supply voltage line 335 to the voltage source 420 for the selected column, whereafter the process ends at step 535.

In addition to the cross capacitance of the power supply voltage line with the relevant bit line assisting in reducing the stability of the addressed memory cell, the cross capacitance also speeds up the write operation itself as it speeds up the lowering of the potential on the relevant bit line.

Figure 7:
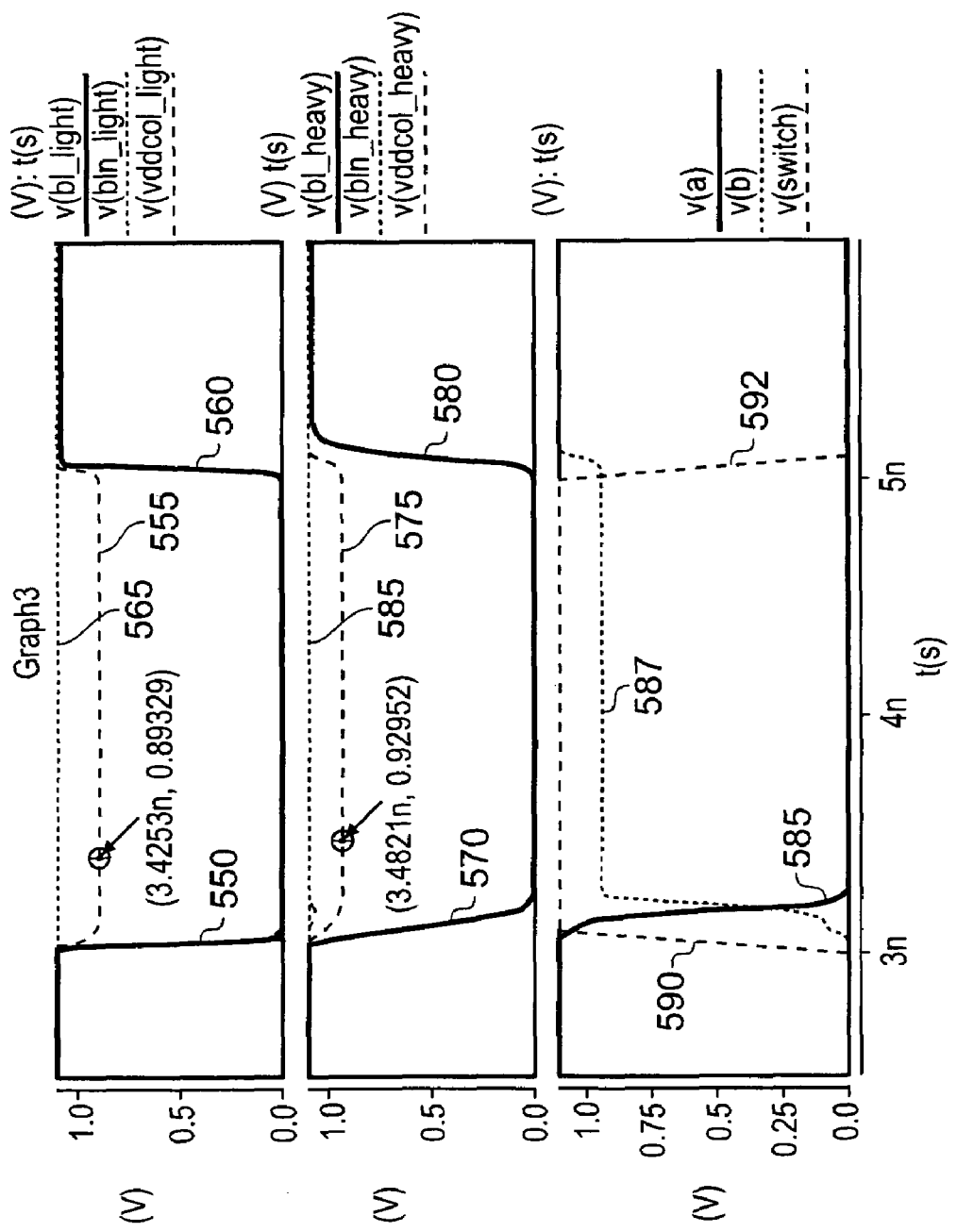
FIG. 7 is a sequence of graphs illustrating the electrical behaviour of the memory device when using the write assist mechanism of one embodiment of the present invention.

FIG. 7 is a sequence of graphs illustrating the electrical behaviour of the relevant parts of the memory device when adopting the write assist mechanism of an embodiment of the present invention. The top graph of FIG. 7 shows the voltage on the pair of bit lines, and the corresponding voltage on the power supply voltage line for a small memory matrix with short bit lines, for example four memory cells per column, whilst the second graph shows the same signals for a larger memory matrix with long bit lines, for example 128 memory cells per column. As can be seen from the top graph, whilst voltage 565 on one of the bit lines is maintained at $V_{DD}$, during the write operation the voltage on the other bit line discharges as shown by line 550, and is then charged back up to $V_{DD}$ at the end of the write operation (as shown by line 560). During the write operation, the decoupling of the power supply voltage line from $V_{DD}$ causes the voltage to drop to the level shown by line 555.

As can be seen by comparison of the second graph with the first graph, again one bit line drops as shown by the lines 570, 580 whilst the other bit line is retained at $V_{DD}$ as shown by the line 585. The voltage drop exhibited on the power supply voltage line is similar to the small memory array, as evidenced by the line 575.

The bottom graph in FIG. 7 shows the value of the switch signal over path 425, and the corresponding voltages at the two internal nodes 140, 150 (see FIG. 3) of the addressed memory cell. The switch signal goes high at step 590 in order to decouple the power supply voltage line 335 from the power supply, whereafter it is assumed that the write operation is causing a change in state within the addressed memory cell, as a result of which the voltage on one of the internal nodes drops as shown by line 585, whilst the other one rises as shown by line 587. However, for the node that is rising towards $V_{DD}$, it can be seen that the level achieved does not reach $V_{DD}$ during the time that the power supply voltage line is decoupled from the power source, due to the lower voltage level on the power supply voltage line. Only when the switch signal returns to a logic zero level (see line 592), and accordingly the power supply voltage line is pulled back up to $V_{DD}$, does the internal node voltage also get pulled up to $V_{DD}$.

The write enable signal to the relevant one of the write transistors 400, 405, and the wordline trigger signal used to enable the relevant word line will also be asserted and de-asserted at the same time as the switch signal, and hence will follow lines 590, 592 as shown in FIG. 7.

Figure 8:
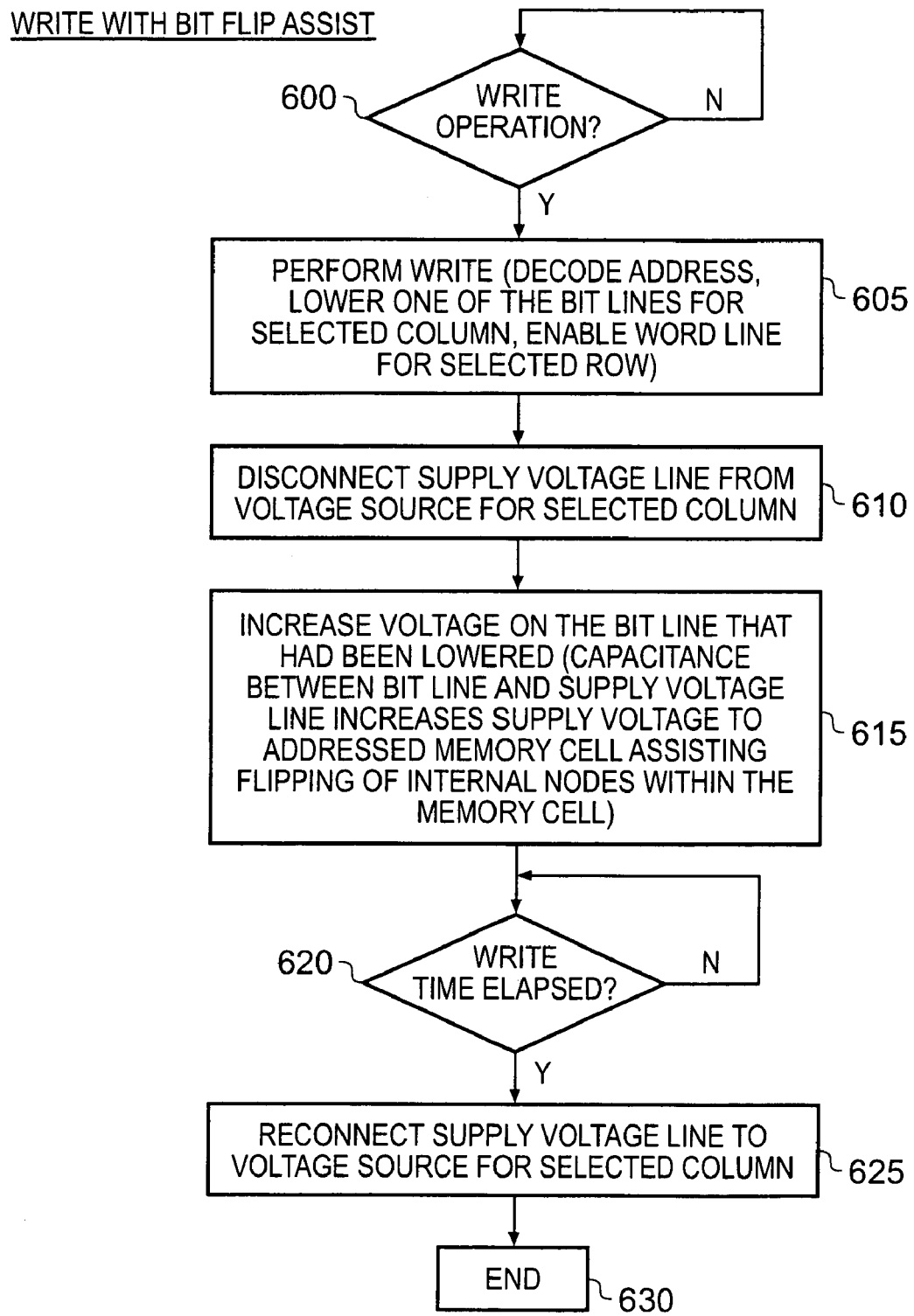
FIG. 8 is a flow diagram illustrating the operation of a bit flip assist mechanism in accordance with one embodiment of the present invention.

Whilst the techniques of embodiments of the present invention are useful to provide a low power write assist mechanism, the use of the techniques of embodiments of the present invention is not restricted to only write assist mechanisms, and instead can be used in a variety of assist mechanisms during memory access operations. In particular, the technique of the present invention can be used at very low voltages, and this makes it useful to combat problems that can occur when using low supply voltages. Once such problem is a bit-flip problem where when writing to an addressed memory cell, the internal nodes may not stabilise out at the new voltage levels, or at least do not do so within the period allowed for a write operation, potentially giving rise to a write failure. In accordance with one embodiment of the present invention, as illustrated in FIG. 8, the circuitry of FIG. 5 can be used to provide a bit flip assist mechanism towards to the end of the write operation. This technique can be used irrespective of whether the basic write assist mechanism described with reference to FIG. 6 is used.

As shown in FIG. 8, on occurrence of a write operation at step 600, the write operation is performed at step 605. In particular, the address is decoded, one of the bit lines for the selected column is lowered to identify the data to be written, and the relevant word line is enabled for the selected row in order to activate the addressed memory cell. The process of FIG. 6 may be used to implement step 605 of FIG. 8 or alternatively a standard write operation may be used at step 605. If the process of FIG. 6 is used to implement step 605, then step 525 identifying elapse of the write time will actually be identifying the elapse of a first predetermined part of the write time, whereafter the supply voltage will be reconnected at step 530 and then the remainder of the write operation identified by steps 610 to 630 of FIG. 8 will be performed.

At step 610, the supply voltage line is disconnected from the voltage source for the selected column, whereafter at step 615 the voltage on the bit line that had been lowered during the earlier part of the write operation is then increased back towards $V_{DD}$. This can be performed as part of a standard precharge operation initiated at the end of the write operation to bring the voltage level on the discharged bit line back up to $V_{DD}$. During this process, the cross capacitance 345, 350 between the relevant bit line and the supply voltage line causes the voltage level on the power supply voltage line 335 to increase, hence raising the supply voltage to the addressed memory cell, thereby improving the stability of that memory cell and assisting in completing the bit flip process within the memory cell.

At step 620 it is determined whether the write time has elapsed, and when it has, the power supply voltage line 335 is reconnected to the voltage source 420 for the selected column at step 625, whereafter the process ends at step 630.

Figure 9:
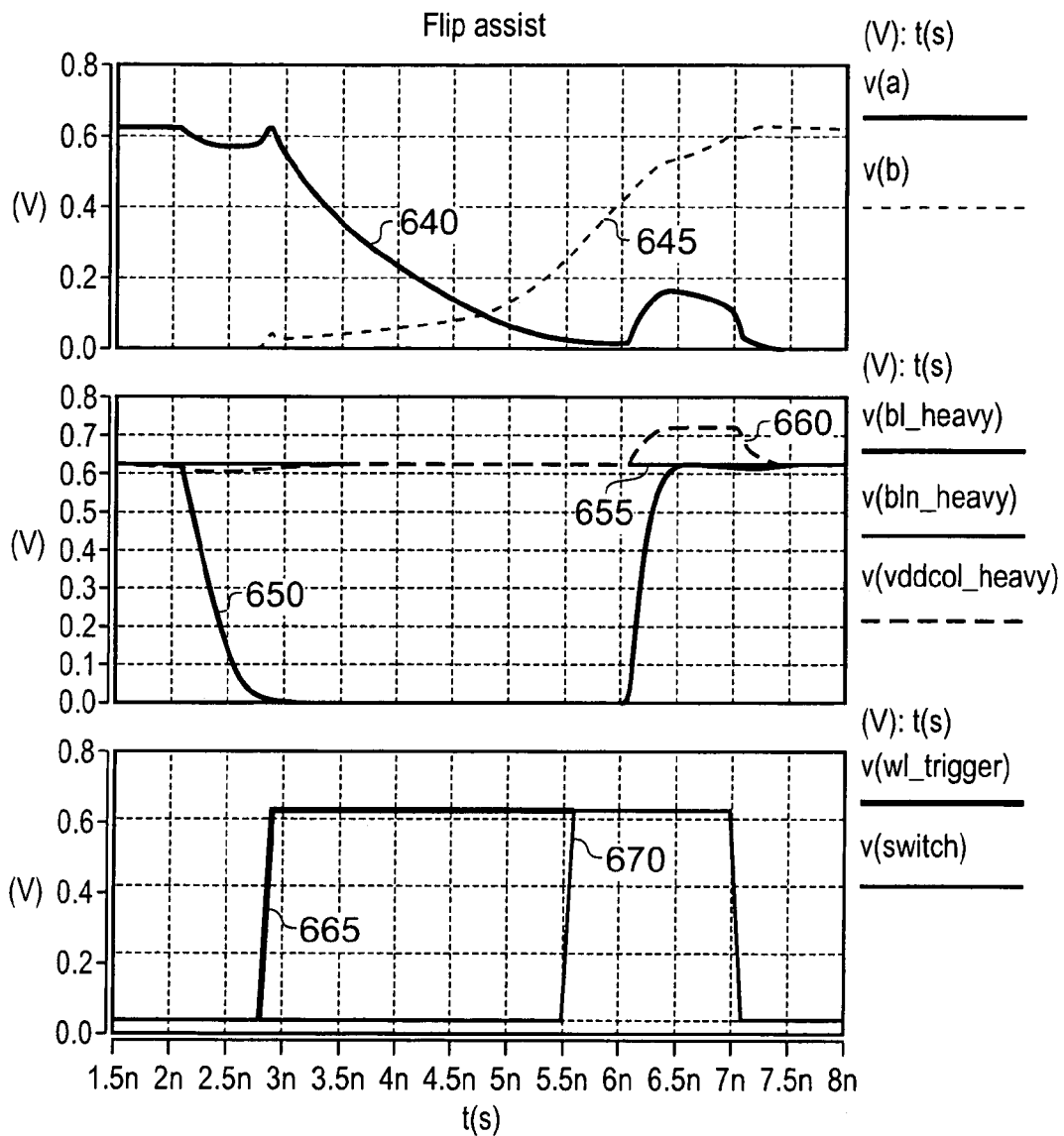
FIG. 9 is a sequence of graphs illustrating the electrical behaviour of the memory device when using the bit flip assist mechanism of FIG. 8.

FIG. 9 is a sequence of graphs illustrating the electrical behaviour of the memory device when implementing the bit flip assist mechanism of embodiments of the present invention. Lines 640, 645 show the flipping in state of the two internal nodes of the addressed memory cell. Line 650 shows the dropping of the voltage level on one of the bit lines at the start of the write operation, and then the increase of the voltage on that bit line back up to $V_{DD}$ during the latter stage of the write operation. The voltage 655 on the other bit line remains constant throughout the write operation. As can be seen by the increase 660 in the voltage level on the power supply column 335, a boost in supply voltage occurs towards the end of the write operation which assists in the bit flip operation. The bottom graph of FIG. 9 shows the voltage 655 applied to the word line to enable the word line during the write operation. In the latter part of the write operation, the voltage on the switch path 425 is increased at point 670 to switch off the transistor 415 and decouple the power supply voltage line 335 from the power supply 420. The voltage on the switch path 425 is then returned to a logic zero level at the same time as the voltage on the word line is reduced to a logic zero level at the end of the write operation.

Figure 10:
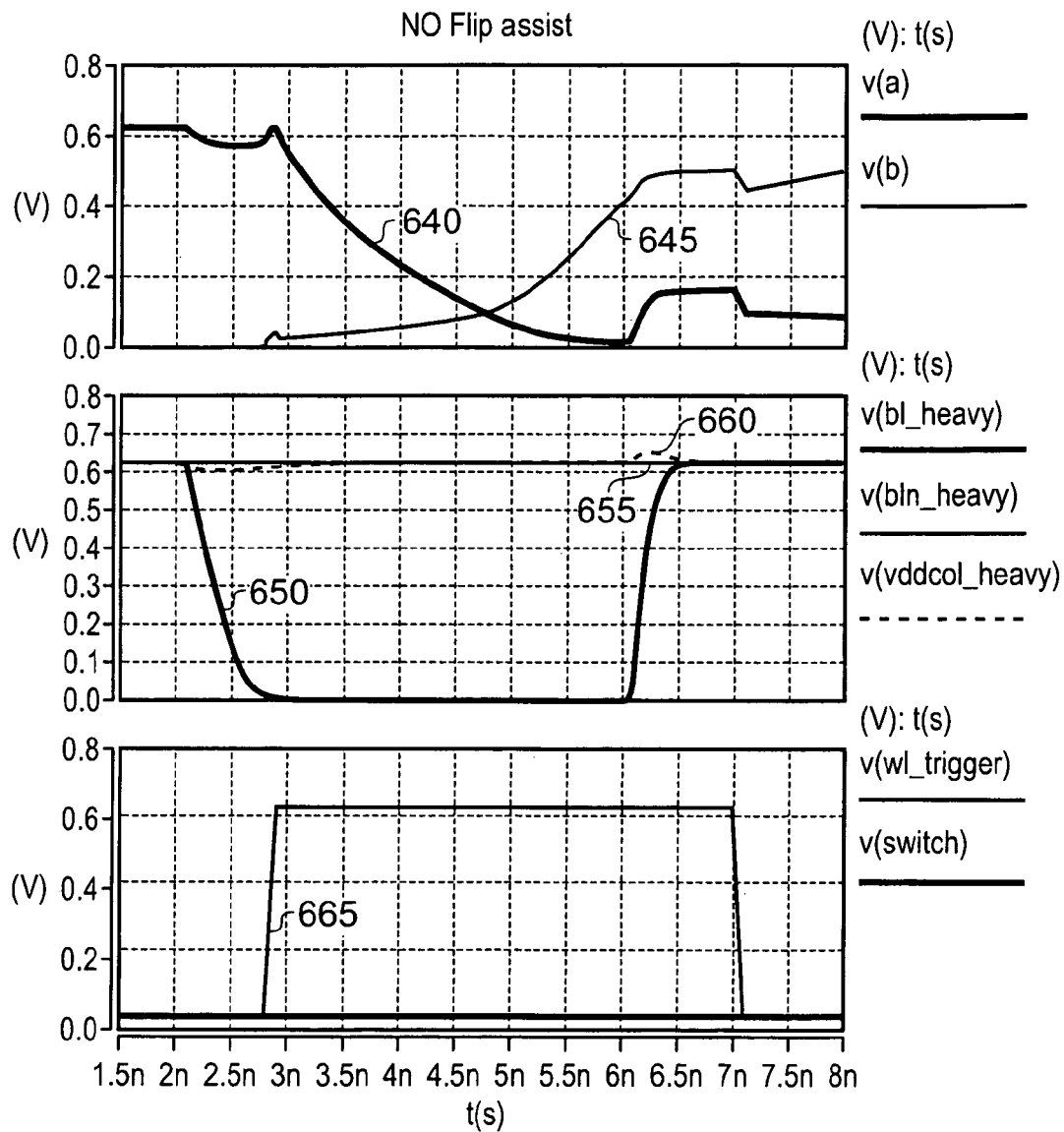
FIG. 10 is a sequence of graphs illustrating the electrical behaviour of the memory device when the bit flip assist mechanism of FIG. 8 is not used.

FIG. 10 illustrates the same sequences of graphs for a situation where the bit flip assist mechanism of an embodiment of the present invention is not used. In the simulation illustrated by FIG. 10, the same circuit is used as in FIG. 9, but the power supply voltage line is not at any stage disconnected from the voltage source. Hence, in this example, there is no switch line enable signal 670 as that mechanism is not used. As can be seen, there is no significant increase in voltage on the power supply voltage line 335 towards the end of the write operation, and the voltages of the internal nodes of the memory cell do not settle out to the logic one, logic zero levels, respectively, as required at the end of the write operation. This should be contrasted with FIG. 9, where the internal nodes within the memory cell settle to the required logic one, logic zero levels within 1.0 ns after the word line is disabled, this being extremely fast particularly at low voltage operation.

The slight dip in the voltage of the power supply voltage line towards the start of the process, and the slight raise in the voltage of the power supply voltage line towards the end of the process are due to cross capacitance, but this effect is mostly suppressed by the switch transistor 415 which connects the power supply voltage line to $V_{DD}$. The reason the effect is not completely suppressed is because the switch transistor 415 is not ideal and has an internal resistance (impedance), and hence whilst that PMOS transistor suppresses the effect it does not suppress it completely.

Another problem that can occur at low operating voltage is that the stability of an SRAM cell can become low and often negative, implying an unstable cell. When the cell becomes unstable, it is possible that the state of the cell will be corrupted when read, giving rise to an error in operation. However, in accordance with one embodiment of the present invention, a read assist mechanism can be provided to improve the stability of the cell during the read operation. A further advantage that can result from the use of such a read assist mechanism is that the read current can be increased, thereby improving the speed of the read operation. This can hence lead to a more robust and fast memory.

Figure 11:
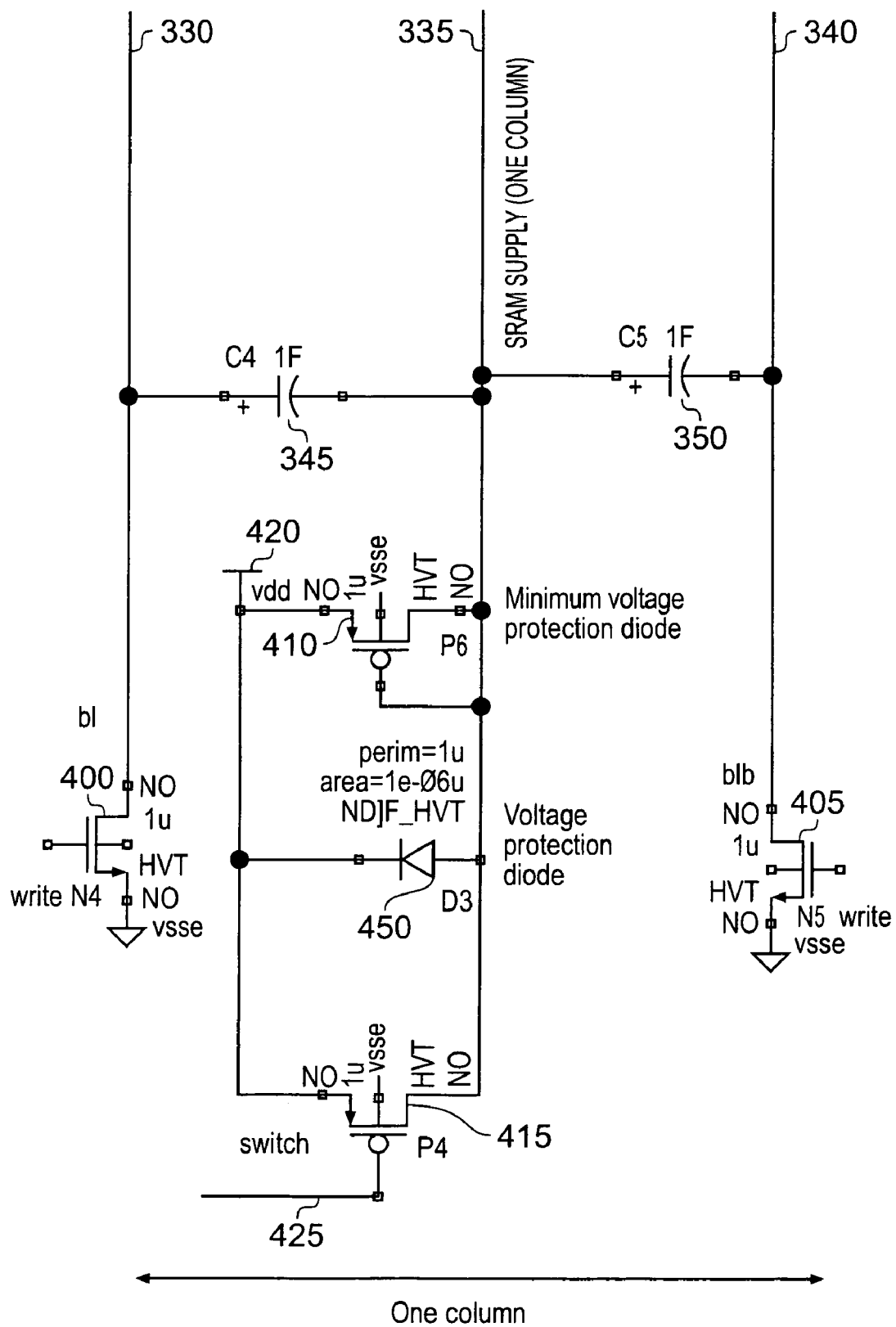
FIG. 11 is a diagram illustrating, for a particular column of the memory device, a read assist mechanism provided in accordance with one embodiment of the present invention.

FIG. 11 is a diagram illustrating components provided within each column of a memory device in accordance with one embodiment of the present invention to provide a read assist mechanism. From a comparison with FIG. 5, it will be appreciated that the circuitry is essentially the same, and the same reference numerals have been used to refer to the same elements. The only addition in FIG. 11 is the provision of an optional reverse biased diode 450 to act as a voltage protection diode, as will be discussed in more detail later.

Figure 12:
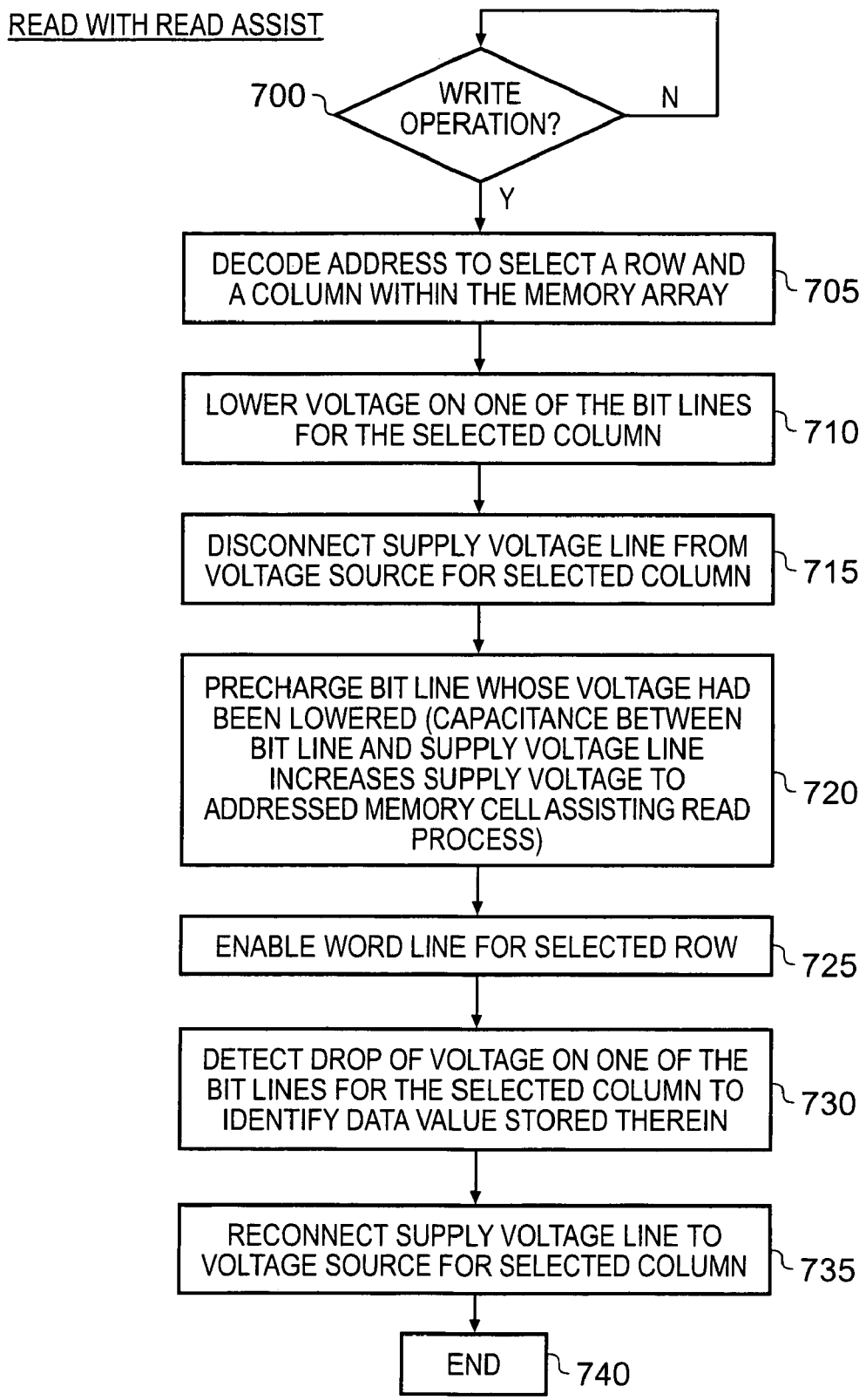
FIG. 12 is a flow diagram illustrating the operation of the read assist mechanism in accordance with one embodiment of the present invention.

FIG. 12 is a flow diagram illustrating the read assist mechanism of this embodiment of the present invention. On occurrence of a read operation at step 700, the address associated with the read operation is decoded at step 705 to select a row and a column within the memory array. Thereafter, at step 710, the voltage on at least one of the bit lines for the selected column is lowered towards ground. To achieve this, one of the write transistors 400, 405 can be turned on to discharge the relevant bit line towards ground. Thereafter, at step 715, the switch-signal over path 425 is set high to disconnect the power supply voltage line 335 from the power supply 420.

Then, at step 720, the bit line whose voltage had been lowered at step 710 is then precharged back towards $V_{DD}$. At this point, capacitance 345, 350 between the relevant bit line and the power supply voltage line gives a boost to the voltage on the power supply voltage line, and hence increases the voltage supply to the addressed memory cell, which will assist in the subsequent read operation.

At step 725, the word line is enabled for the selected row. As with the earlier discussion of the write operation, it will be appreciated that the word line can be enabled at any suitable point following the decoding of the address at step 705 and hence may occur at least partially in parallel with one or all of steps 710, 715, 720.

At step 730, the normal read operation is employed, whereby the voltage drop on one of the pair of bit lines is detected by sense amplifier circuitry in order to identify the data value stored in the addressed memory cell. Thereafter, at step 735, the power supply voltage line 335 is reconnected to the voltage source 420 for the selected column, whereafter the process ends at step 740.

Whilst the operation described above may be used to provide a read assist mechanism which is useful when low operating voltages are being employed (e.g. 600 mV), it is also appropriate for the same design of memory device to be able to be operated at normal operating voltages (e.g. 1V). Hence the forward biased diode 410 may be retained in the design for the same reasons as discussed earlier with reference to FIG. 5. Also, to protect against the above described read assist mechanism being employed whilst a normal operating voltage is being used, and thus potentially causing the boost in voltage on the power supply voltage line 335 to exceed the maximum safe voltage having regard to the technology used for the memory cells, a reverse biased diode 450 can be placed between the power supply 420 and the column supply line 335 so as to limit the boost in voltage. In particular, if the voltage on the power supply line 335 exceeds the power supply line 420 by greater than the threshold voltage of the diode 450, the diode 450 will turn on to reduce the voltage on the power supply voltage line 335 back to within safe limits.

Figure 13:
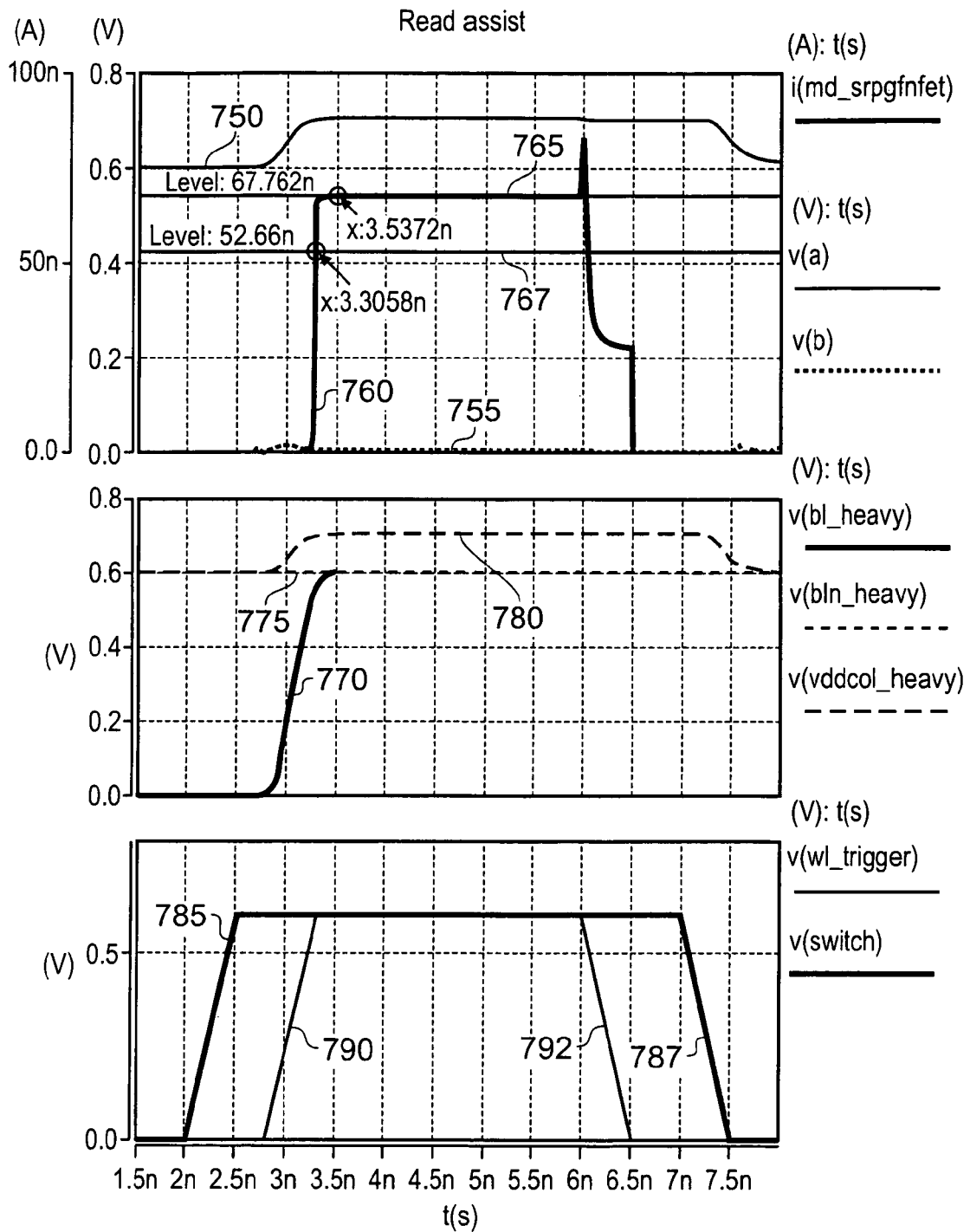
FIG. 13 is a sequence of graphs illustrating the electrical behaviour of the memory device when employing the read assist mechanism of FIG. 12.

FIG. 13 is a sequence of graphs illustrating the electrical behaviour of the memory device when employing the read assist mechanism of embodiments of the present invention. As shown from the top graph, during the read operation, the voltage on the logic one level internal node is boosted to the level 750 during the read operation, whilst the voltage level 755 on the logic zero level node is retained at the logic zero level. During the read operation, the read current increases rapidly at step 760, and reaches a level 765 which exceeds that that would be expected without the read assist feature (indicated by the line 767). This increase in read current increases the speed of the read operation.

The second graph in FIG. 13 shows how following the discharge of the voltage on one of the bit lines, the voltage on that bit line is increased at the start of the read operation as shown by line 770, the other bit line having been retained at the logic one level (as shown by the line 775). This increase in the voltage on the bit line indicated by the path 770 gives rise to the boost in voltage on the power supply column line 335 (shown by the line 780).

The line 785, 787 in the lower graph shows the profile of the switch signal provided to the transistor 415 over the path 425 whilst the line 790, 792 shows the profile of the word line trigger signal used to enable the relevant word line for the read operation.

From FIG. 13, it will be appreciated that a read current is observed which is approximately 30% higher than would otherwise be the case. Further, the higher voltage on the column supply voltage line leads to a more stable cell. Together with the lower voltage on the bit line (which is at the normal $V_{DD}$ level), this leads to even higher stability. It has been found that this approach can readily lead to 100% increase in the stability of the cell.

In extreme cases where the normal stability of the cell is particularly compromised, both of the bit lines can be discharged prior to the read operation, and then both bit lines can be precharged at the start of the read operation, thereby generating an even higher boosted column supply voltage.

Figure 14:
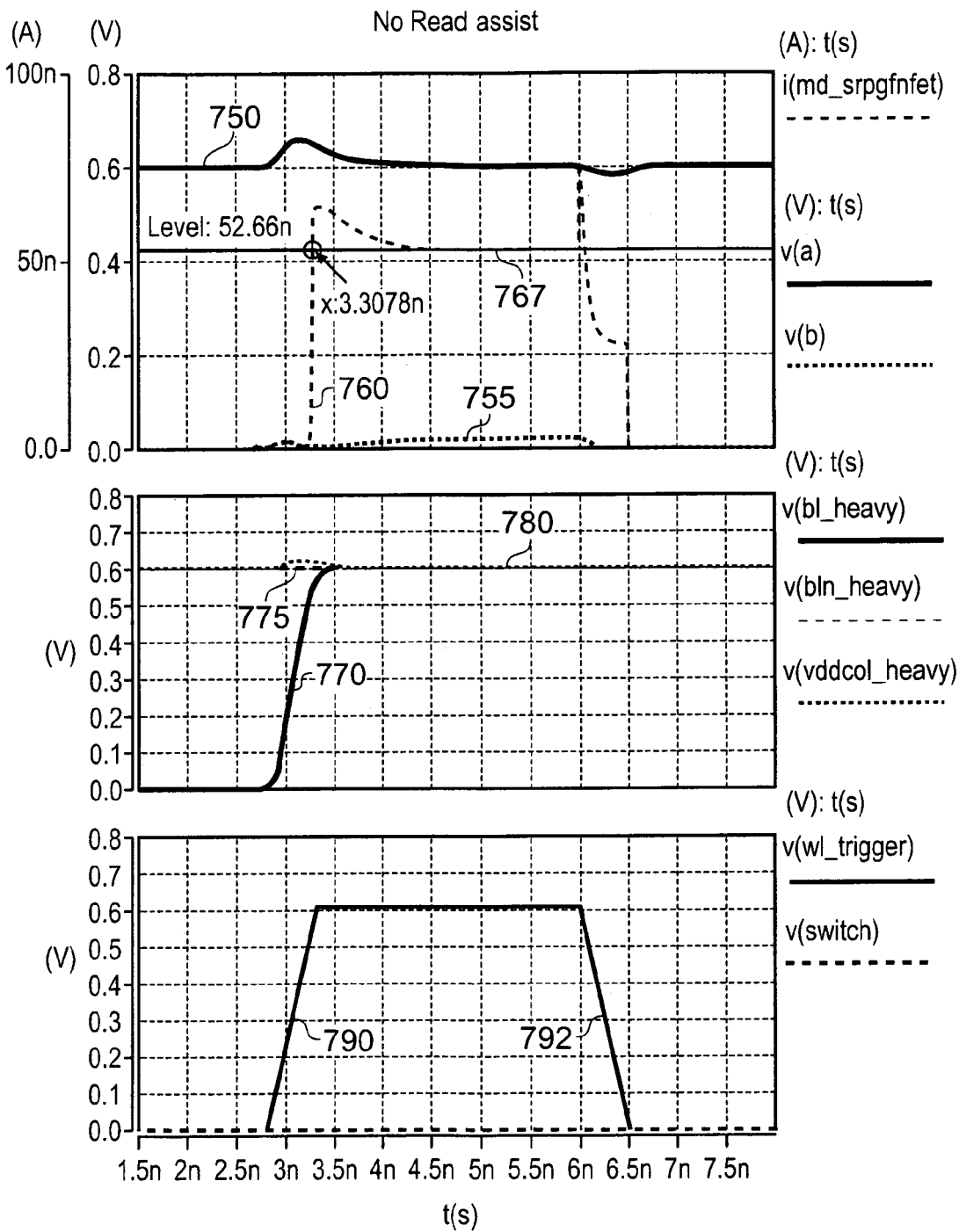
FIG. 14 is a sequence of graphs illustrating the electrical behaviour of the memory device when the read assist mechanism of FIG. 12 is not employed.

FIG. 14 is a similar sequence of graphs illustrating a situation where no read assist circuitry is used. In the simulation illustrated by FIG. 14, the same circuit is used as in FIG. 13, but the power supply voltage line is not at any stage disconnected from the voltage source. The same reference numerals have been used as in FIG. 13 to illustrate the same signals. As can be seen, the current observed during the read operation is significantly less than when using the read assist mechanism of embodiments of the present invention. Further, there is no boost to the voltage level on the column supply line.

The slight raise in the voltage of the power supply voltage line towards the start of the process is due to cross capacitance, but this effect is mostly suppressed by the switch transistor 415 which connects the power supply voltage line to $V_{DD}$. As explained earlier with reference to FIG. 10, the reason the effect is not completely suppressed is because the switch transistor 415 is not ideal and has an internal resistance (impedance), and hence whilst that PMOS transistor suppresses the effect it does not suppress it completely.

From the above description of embodiments of the present invention, it will be seen that by making use of cross capacitance between a supply voltage line and associated bit lines during predetermined periods of memory access operations, this leads to a very flexible assist mechanism that can be used in a variety of instances to assist in completion of memory access operations within memory cells, thereby improving yield by improving the number of cells that pass their functional tests. Due to the fact that techniques of the present invention make use of charge redistribution, the solution provided is particularly power efficient. For example, considering the write assist mechanism, no additional power is incurred over a normal write operation that is not provided with the write assist mechanism. Indeed, in some situations, the use of the technique of embodiments of the present invention will reduce the power consumption, since the write operation will occur more quickly.

The technique of embodiments of the present invention is generally applicable across a variety of technologies, and for various different kinds of memory cells. For example, the invention can be used irrespective of whether the individual memory cells are constructed using bulk CMOS (Complementary Metal Oxide Semiconductor) technology or are alternatively constructed using SOI (Silicon-On-Insulator) technology. Further, techniques of embodiments of the present invention are not only restricted to memory cells arranged as six transistor cells as shown in FIG. 3, but can apply to various other types of memory cells, provided that there is a cross capacitance between the supply voltage line and the one or more bit lines used by the cell. The invention is equally applicable to memory devices that are single ported devices, or to multi ported devices providing separate write and read paths.

Although a particular embodiment of the invention has been described herein, it will be apparent that the invention is not limited thereto, and that many modifications and additions may be made within the scope of the invention. For example, various combinations of the features of the following dependent claims could be made with the features of the independent claims without departing from the scope of the present invention.

We claim:

1. A memory device comprising:
a plurality of memory cells arranged in at least one column;
at least one bit line associated with each of said at least one columns, during a memory access operation a change in voltage on said at least one bit line associated with a selected column indicating a data value for an addressed memory cell in that selected column;
a supply voltage line associated with each of said at least one columns, the supply voltage line being connectable to a voltage source to provide a supply voltage to the associated column, for each column a capacitance existing between the associated supply voltage line and the associated at least one bit line; and
control circuitry for controlling, for each column, connection of the voltage source to the associated supply voltage line, for a predetermined period during the memory access operation the control circuitry disconnecting the supply voltage line for at least the selected column from the voltage source, such that a voltage level on that supply voltage line changes in response to the change in voltage on the associated at least one bit line.

2. A memory device as claimed in claim 1, wherein the plurality of memory cells are arranged as an array comprising a plurality of rows and a plurality of columns, during the memory access operation a selected row from said plurality being enabled to identify the addressed memory cell in said selected column.

3. A memory device as claimed in claim 1, wherein for each column said associated at least one bit line comprises a pair of bit lines, and during the memory access operation a differential in voltage between the pair of bit lines associated with a selected column indicating a data value for the addressed memory cell in that selected column.

4. A memory device as claimed in claim 1, wherein the memory access operation is a write operation, during the write operation the voltage on said at least one bit line associated with the selected column being changed to indicate a new data value to be stored in the addressed memory cell, prior to changing the voltage on said at least one bit line, the control circuitry disconnecting the supply voltage line for at least the selected column from the voltage source, such that the voltage level on that supply voltage line changes in response to the subsequent change in voltage on the associated at least one bit line.

5. A memory device as claimed in claim 1, wherein an amount by which the voltage level on a supply voltage line changes in response to the change in voltage on the associated at least one bit line depends on the capacitance existing between that supply voltage line and the associated at least one bit line and the capacitance of the supply voltage line, at least one of said capacitances being tuned during design of the memory device having regard to a desired amount for the change of the voltage level on the supply voltage line.

6. A memory device as claimed in claim 1, wherein an amount by which the voltage level on a supply voltage line changes in response to the change in voltage on the associated at least one bit line depends on the capacitance existing between that supply voltage line and the associated at least one bit line and the capacitance of the supply voltage line, the memory device further comprising one or more components selectively connected to each supply voltage line to allow the capacitance of that supply voltage line to be tuned after production having regard to a desired amount for the change of the voltage level on that supply voltage line.

7. A memory device as claimed in claim 1, wherein the memory access operation is a write operation, during the write operation the voltage on said at least one bit line associated with the selected column being changed to indicate a new data value to be stored in the addressed memory cell, after changing the voltage on said at least one bit line, the control circuitry disconnecting the supply voltage line for at least the selected column from the voltage source, such that the voltage level on that supply voltage line changes in response to a subsequent change in voltage on the associated at least one bit line.

8. A memory device as claimed in claim 1, wherein the memory access operation is a read operation, during the read operation the voltage on said at least one bit line associated with the selected column is precharged to a first voltage level during a precharge stage, whereafter said voltage on said at least one bit line associated with the selected column changes from said first voltage level in dependence on the data value stored in the addressed memory cell, the control circuitry disconnecting the supply voltage line for at least the selected column from the voltage source during the precharge stage, such that the voltage level on that supply voltage line changes in response to the change in voltage on the associated at least one bit line during the precharge stage.

9. A memory device as claimed in claim 4, wherein said at least one bit line associated with the selected column is precharged to a first voltage level, and during the write operation the new data value is indicated by lowering the voltage on said at least one bit line from the first voltage level, the capacitance between said at least one bit line and the associated supply voltage line causing a lowering of the supply voltage to the addressed memory cell lowering the stability of the addressed memory cell.

10. A memory device as claimed in claim 9, wherein:
for each column said associated at least one bit line comprises a pair of bit lines, both of the bit lines in the pair of bit lines associated with the selected column being precharged to said first voltage level; and
during the write operation the voltage on one of the bit lines in the pair being lowered such that the differential in voltage between the pair of bit lines indicates the new data value to be stored in the addressed memory cell.

11. A memory device as claimed in claim 9, wherein the control circuitry further comprises diode circuitry provided for each column to couple the voltage source to the associated supply voltage line, the diode circuitry operating to avoid the supply voltage on the associated supply voltage line dropping below a predetermined threshold value, thereby securing memory retention functionality of any non-addressed memory cells in the selected column.

12. A memory device as claimed in claim 7, wherein during the write operation the new data value is indicated by lowering the voltage on said at least one bit line associated with the selected column, towards the end of the write operation the voltage on said at least one bit line being increased whilst the supply voltage line for at least the selected column is disconnected from the voltage source, the capacitance between said at least one bit line and the associated supply voltage line causing an increase of the supply voltage to the addressed memory cell, thereby improving stabilisation of the new data value within the addressed memory cell.

13. A memory device as claimed in claim 12, wherein:
for each column said associated at least one bit line comprises a pair of bit lines; and
during the write operation the voltage on one of the bit lines in the pair being lowered such that the differential in voltage between the pair of bit lines indicates the new data value to be stored in the addressed memory cell;
towards the end of the write operation the voltage on said one of the bit lines being increased whilst the supply voltage line for at least the selected column is disconnected from the voltage source.

14. A memory device as claimed in claim 8, wherein the voltage on said at least one bit line associated with the selected column increases during the precharge stage, whereafter said voltage on said at least one bit line lowers from said first voltage level in dependence on the data value stored in the addressed memory cell, the capacitance between said at least one bit line and the associated supply voltage line causing an increase of the supply voltage to the addressed memory cell during the precharge stage, thereby increasing stability of the addressed memory cell for the read operation.

15. A memory device as claimed in claim 14, wherein:
for each column said associated at least one bit line comprises a pair of bit lines, at least one of the bit lines in the pair of bit lines associated with the selected column being precharged in said precharge stage; and
during the read operation the voltage on one of the bit lines in the pair being lowered such that the differential in voltage between the pair of bit lines indicates the data value stored in the addressed memory cell.

16. A memory device as claimed in claim 14, wherein the control circuitry further comprises diode circuitry provided for each column to couple the voltage source to the associated supply voltage line, the diode circuitry operating to avoid the supply voltage on the associated supply voltage line increasing above a predetermined threshold value.

17. A memory device comprising:
a plurality of memory cells means arranged in at least one column;
at least one bit line means associated with each of said at least one columns, during a memory access operation a change in voltage on said at least one bit line means associated with a selected column indicating a data value for an addressed memory cell means in that selected column;
a supply voltage line means associated with each of said at least one columns, the supply voltage line means being connectable to a voltage source means for providing a supply voltage to the associated column, for each column a capacitance existing between the associated supply voltage line means and the associated at least one bit line means; and
control means for controlling, for each column, connection of the voltage source means to the associated supply voltage line means, for a predetermined period during the memory access operation the control means disconnecting the supply voltage line means for at least the selected column from the voltage source means, such that a voltage level on that supply voltage line means changes in response to the change in voltage on the associated at least one bit line means.

18. A method of operating a memory device, the memory device having a plurality of memory cells arranged in at least one column, and at least one bit line associated with each of said at least one columns, during a memory access operation a change in voltage on said at least one bit line associated with a selected column indicating a data value for an addressed memory cell in that selected column, the memory device further having a supply voltage line associated with each of said at least one columns, the supply voltage line being connectable to a voltage source to provide a supply voltage to the associated column, for each column a capacitance existing between the associated supply voltage line and the associated at least one bit line, the method comprising the steps of:
controlling, for each column, connection of the voltage source to the associated supply voltage line; and
for a predetermined period during the memory access operation, disconnecting the supply voltage line for at least the selected column from the voltage source, such that a voltage level on that supply voltage line changes in response to the change in voltage on the associated at least one bit line.

* * * * *